(12) United States Patent
Kubo et al.

(10) Patent No.: US 7,002,397 B2
(45) Date of Patent: Feb. 21, 2006

(54) METHOD OF SETTING BACK BIAS OF MOS CIRCUIT, AND MOS INTEGRATED CIRCUIT

(75) Inventors: Masaharu Kubo, Hachioji (JP);
Mitsuru Hiraki, Kodaira (JP);
Hiroyuki Mizuno, Kokubunji (JP);
Syuji Ikeda, Koganei (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/401,734

(22) Filed: Mar. 31, 2003

(65) Prior Publication Data
US 2003/0218494 A1 Nov. 27, 2003

Related U.S. Application Data

(63) Continuation of application No. 09/890,170, filed as application No. PCT/JP99/07034 on Dec. 15, 1999, now abandoned.

(30) Foreign Application Priority Data

Jan. 26, 1999 (JP) .................................. 11-017460

(51) Int. Cl.
*H03K 3/01* (2006.01)
(52) U.S. Cl. ..................... 327/534; 327/537
(58) Field of Classification Search ................ 327/534, 327/564, 565, 535, 537
See application file for complete search history.

(56) References Cited

U.S. PATENT DOCUMENTS

| 5,483,152 | A | 1/1996 | Hardee et al. ............. 323/314 |
| 5,557,231 | A | 9/1996 | Yamaguchi et al. ........ 327/534 |
| 5,570,005 | A | 10/1996 | Hardee et al. ............. 323/314 |
| 5,583,457 | A | 12/1996 | Horiguchi et al. .......... 326/121 |
| 5,592,010 | A | 1/1997 | Kakumu et al. ............. 257/368 |
| 5,659,517 | A | 8/1997 | Arimoto et al. ............. 365/226 |
| 5,814,899 | A | 9/1998 | Okumura et al. ............. 307/64 |
| 5,838,047 | A | 11/1998 | Yamauchi et al. .......... 257/372 |

FOREIGN PATENT DOCUMENTS

| JP | 1-206661 | 8/1989 |
| JP | 3-23591 | 1/1991 |
| JP | 3-136365 | 6/1991 |
| JP | 4-18762 | 1/1992 |
| JP | 5-108194 | 4/1993 |

(Continued)

OTHER PUBLICATIONS

Yamamoto, Toyoji, et al. "A New CMOS Structure for Low Temperature Operation with Forward Substrate Bias," IEEE 1992 Symposium on VLSI Technology, Digest of Technical Papers, 1992, pp. 104-105.

(Continued)

*Primary Examiner*—Kenneth B. Wells
(74) *Attorney, Agent, or Firm*—Miles & Stockbridge P.C.

(57) ABSTRACT

In a MOS circuit comprising a plurality of MOSFETs constituting a digital circuit, an input signal is supplied to the digital circuit, and a first back bias voltage is supplied to a semiconductor substrate or a semiconductor well region in which the MOSFETs are formed, so that a pn junction between the semiconductor substrate or the semiconductor well region and a source region is brought to a forward voltage. In a non-operating state in which a circuit operation is suspended by the input signal supplied to the digital circuit as a fixed level, a second back bias voltage is applied to the semiconductor substrate or the semiconductor well region so that the pn junction between the semiconductor substrate or the semiconductor well region and the source region is brought to a reverse voltage.

3 Claims, 24 Drawing Sheets

FOREIGN PATENT DOCUMENTS

| | | |
|---|---|---|
| JP | 6-21443 | 1/1994 |
| JP | 6-53496 | 2/1994 |
| JP | 6-89574 | 3/1994 |
| JP | 6-216346 | 8/1994 |
| JP | 6-237164 | 8/1994 |
| JP | 6-282987 | 10/1994 |
| JP | 8-83487 | 3/1996 |
| JP | 8-204140 | 8/1996 |
| JP | 8-274620 | 10/1996 |
| JP | 9-8645 | 1/1997 |
| JP | 9-36246 | 2/1997 |
| JP | 9-214321 | 8/1997 |
| JP | 10-189883 | 7/1998 |

OTHER PUBLICATIONS

Sato, Katusyuki et al., "A 20ns Static Column 1 Mb DRAM in CMOS Technology," IEEE International Solid-State Circuits Conference, Digest of Technical Papers, 1985, pp. 254-255.

(A) NMOS  (B) PMOS

| OPERATION MODE | SUBSTRATE BIAS VOLTAGE LEVEL |
|---|---|
| RESET | +V2 |
| NORMAL OPERATION | +V2 |
| SLEEP | +V2 |
| DEEP SLEEP | +V2 |
| STANDBY | −V1 |
| HARDWARE STANDBY | −V1 |
| RTC BATTERY BACKUP | −V1 |
| IDDQ MEASUREMENT | −V1 |

| | SLEEP MODE | DEEP SLEEP MODE | STANDBY MODE |
|---|---|---|---|
| POWER CONSUMPTION | △ | ○ | ◎ |
| DMA TRANSFER | ENABLE | PROHIBIT | PROHIBIT |
| MEMORY REFRESH | NORMAL REFRESH | SELF REFRESH | SELF REFRESH |
| RECOVERY TIME | FAST | FAST | SLOW |
| SUBSTRATE BIAS VOLTAGE LEVEL | +V2 | +V2 | −V1 |

FIG. 17

|  | SLEEP MODE | DEEP SLEEP MODE |
|---|---|---|
| CPU | STOP | STOP |
| FPU | STOP | STOP |
| CACHE | STOP | STOP |
| BSC | OPERATION | STOP |
| DMAC | OPERATION | STOP |
| SCI | OPERATION | STOP |
| INTC | OPERATION | OPERATION |
| CPG | OPERATION | OPERATION |

|     | OPERATION MODE | STANDBY MODE |
|-----|----------------|--------------|
| PW1 | $+\Delta V$    | $-V_{bb}$    |
| NW1 | $V_{DD}-\Delta V$ | $V_{DD}+V_{bb}$ |
| PW2 | 0              | $-V_{bb}$    |
| NW2 | $V_{DD}$       | $V_{DD}+V_{bb}$ |

METHOD OF SETTING BACK BIAS OF MOS CIRCUIT, AND MOS INTEGRATED CIRCUIT

CROSS-REFERENCE TO RELATED APPLICATIONS

This application is a continuation of application Ser. No. 09/890,170 filed Jul. 26, 2001, which is a 371 of International Application No. PCT/JP99/07034 filed Dec. 15, 1999.

TECHNICAL FIELD

The present invention relates to a method of setting back biases of a MOS circuit and a MOS integrated circuit, and principally to a technology effective for application to a technology for reducing a subthreshold leak current produced in a CMOS (Complementary MOS) circuit.

BACKGROUND ART

After the present invention has been brought to completion, the present inventors have investigated the known references about the following viewpoints A and B on the basis of the result of the invention. The viewpoint A is one wherein a potential at a semiconductor well in which an n channel type MOSFET or a p channel type MOSFET is formed, is biased in a weak forward direction with respect to a source potential. The viewpoint B is one wherein a potential at a semiconductor well in which an n channel type MOSFET or a p channel type MOSFET is formed, is biased in a backward direction with respect to a source potential.

As to the viewpoint A, the following publications have been found out.

(1) IEEE 1992 symposium on VLSI Technology Digest of Technical paper, pp 104–105, (2) Unexamined Patent Publication No. Hei 6(1994)-21443, (3) Unexamined Patent Publication No. Hei 6(1994)-216346, (4) Unexamined Patent Publication No. Hei 3(1991)-23591, (5) Unexamined Patent Publication No. Hei 1(1989)-206661, (6) Unexamined Patent Publication No. Hei 3(1991)-136365, and (7) Unexamined Patent Publication No. Hei 8(1996)-204140.

As to the viewpoint B, the following publications have been found out.

(8) Unexamined Patent Publication No. Hei 8(1996)-274620, (9) Unexamined Patent Publication No. Hei 5(1993)-108194,

(10) Unexamined Patent Publication No. Hei 6(1994)-53496, and

(11) Unexamined Patent Publication No. Hei 6(1994)-89574.

A configuration wherein a back bias voltage of each MOSFET is changed, is common among the respective references. However, problems and effects to be solved by the application of back bias voltages to the MOSFETs vary widely. Even in the case of any of them, such ones as to expect problems, configurations and effects to be solved by the invention of the present application are not found.

The inventors of the present application have lead to the development of a novel method of setting back biases of a MOS circuit and a novel MOS integrated circuit both intended for the solution of such a technical problem that a high-speed operation and low power consumption are placed in a mutually contradictory relationship as in the case where when attempt is made to achieve the high-speed operation upon development of a MOS integrated circuit suitable for device scale-down and portability of an electronic device, the low power consumption increases correspondingly, whereas when priority is given to the low power consumption in reverse, the high-speed operation is sacrificed.

Thus, the present invention aims to provide a method of setting back biases of a MOS circuit wherein a speeding up and low power consumption have been implemented, and a MOS integrated circuit. Another object of the present invention is to provide a method of setting back biases of a MOS circuit wherein a speeding up and low power consumption have been implemented without complicating a manufacturing process. The above, other objects and novel features of the present invention will become apparent from the description of the present specification and the accompanying drawings.

DISCLOSURE OF THE INVENTION

Summaries of typical ones of the inventions disclosed in the present application will be explained in brief as follows: There is provided a method of setting back biases of a MOS circuit comprising a plurality of MOSFETs constituting a digital circuit, wherein on condition that an influence is not exerted on an operation corresponding to a signal inputted to the MOSFETs in the case of an operating state in which an input signal is supplied to the digital circuit to obtain an output current corresponding to the input signal, a first back bias voltage is supplied to a semiconductor substrate or a semiconductor well region in which the MOSFETs are formed, so that a pn junction between the semiconductor substrate or the semiconductor well region and a source region is brought to a forward voltage, and in the case of a non-operating state in which a circuit operation is suspended by the input signal supplied to the digital circuit as a fixed level, a second back bias voltage is applied to the semiconductor substrate or the semiconductor well region so that the pn junction between the semiconductor substrate or the semiconductor well region and the source region is brought to a reverse voltage.

There is provided a MOS integrated circuit comprising a digital circuit comprised of a plurality of MOSFETs, and a bias circuit which supplies a back bias voltage to a semiconductor substrate or a semiconductor well region in which the MOSFETs are formed, wherein on condition that an influence is not exerted on an operation corresponding to a signal inputted to the MOSFETs in the case of an operating state in which an input signal is supplied to the digital circuit to obtain an output current corresponding to the input signal, the bias circuit supplies a first back bias voltage to a semiconductor substrate or a semiconductor well region in which the MOSFETs are formed, so that a pn junction between the semiconductor substrate or the semiconductor well region and a source region is brought to a forward voltage, and in the case of a non-operating state in which a circuit operation is suspended by the input signal supplied to the digital circuit as a fixed level, the bias circuit supplies a second back bias voltage to the semiconductor substrate or the semiconductor well region so that the pn junction between the semiconductor substrate or the semiconductor well region and the source region is brought to a reverse voltage.

BRIEF DESCRIPTION OF THE DRAWINGS

FIG. 17 is a diagram showing the relationship between the respective circuit blocks and operation modes for describing the difference between sleep mode and deep sleep mode of the one-chip microcomputer according to the present invention;

BEST MODE FOR CARRYING OUT THE INVENTION

The present invention will be explained in accordance with the accompanying drawings to describe it in more details.

Figure 1:
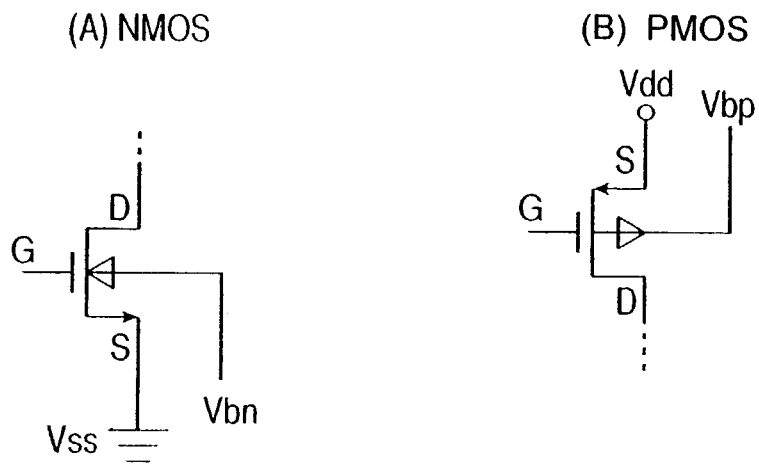
FIG. 1 is a configurational view for describing a method of setting a back bias of a MOS circuit according to the present invention.

A configurational diagram for describing a method of setting a back bias of a MOS circuit according to the present invention is shown in FIG. 1. An example of a back bias setting method with respect to an n channel type MOSFET that constitutes the MOS circuit, is shown in FIG. 1(A). An example of a back bias setting method with respect to a p channel type MOSFET is shown in FIG. 1(B). Thus, a CMOS circuit comprised of an n channel type MOSFET and a p channel type MOSFET makes use of a combination of the back bias setting methods shown in FIGS. 1(A) and 1(B).

In the present application, the term "MOS" is understood as a metal oxide semiconductor configuration originally called for simplicity or brevity. However, the recent generally-named MOSs include those obtained by changing a metal of essential portions of a semiconductor device to an electrical conductor such as polysilicon which does not belong to the metal and changing oxide to another insulator. Also CMOSs are now understood as having a wide technical meaning corresponding to a change in how to grasp the MOSs referred to above. MOSFETs are also similarly taken as the meaning including such a wide construction as substantially taken as an insulated-gate field effect transistor without being understood in a narrow sense. CMOSs, MOSFETs, etc. employed in the present invention follow general naming.

In FIG. 1(A), a source S of an n channel type MOSFET is connected to a circuit's ground potential point. An input signal is supplied to a gate G of the n channel type MOSFET, and an output signal corresponding to the input signal supplied to the gate G thereof is obtained from a drain D thereof. A back bias voltage (substrate bias voltage) Vb is supplied to a p type semiconductor substrate or semiconductor region (well region) with a back gate of the n channel type MOSFET, i.e., the source S and drain D of the n channel type MOSFET formed thereon.

In FIG. 1(B), a source S of a p channel type MOSFET is supplied with a circuit's operating voltage Vdd. An input signal is supplied to a gate G of the p channel type MOSFET, and an output signal corresponding to the input signal supplied to the gate G is obtained from a drain D thereof. A back bias voltage (substrate bias voltage) Vbp is supplied to an n type semiconductor substrate or semiconductor region (well region) with a back gate of the p channel type MOSFET, i.e., the source S and drain D of the p channel type MOSFET formed thereon.

Figure 2:
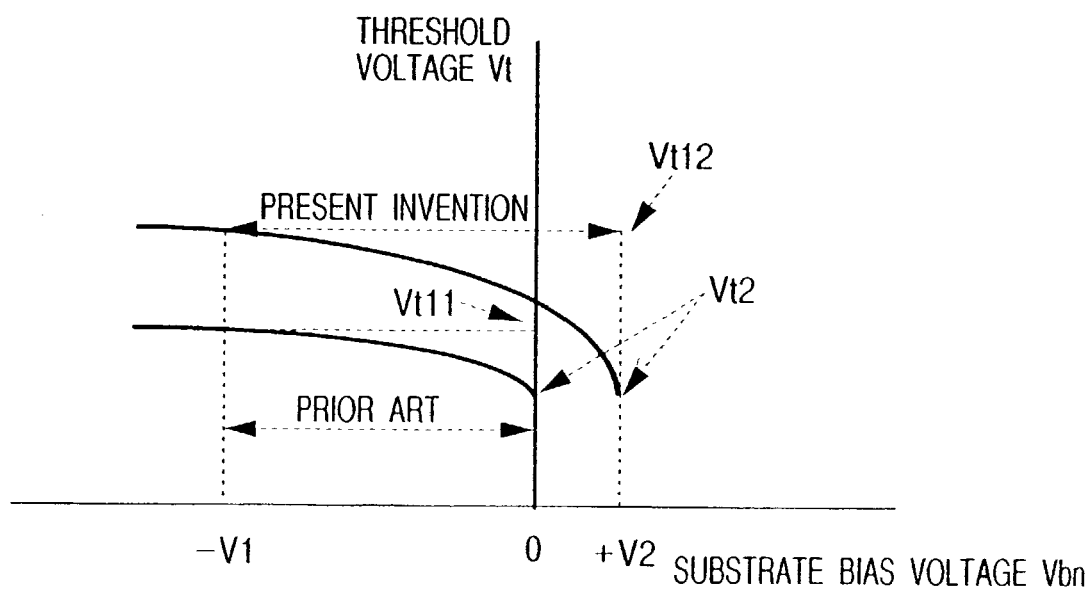
FIG. 2 is a characteristic diagram for describing the relationship between a substrate bias voltage Vbn and a threshold voltage Vt with an n channel type MOSFET as an example.

A characteristic diagram for describing the relationship between a substrate bias voltage Vbn and a threshold voltage Vt with an n channel type MOSFET as an example is shown in FIG. 2. In the back bias setting method according to the present invention, the substrate bias voltages Vbn supplied to the n channel type MOSFET are given as a positive voltage like +V2 and a negative voltage like −V1. The positive voltage like +V2 is set to a weak forward bias voltage equivalent to such an extent or level as not to cause such a forward current as to inhibit the corresponding circuit operation to flow into pn formed between the source of the n channel type MOSFET and a p type substrate or well region with the source formed thereon. Described specifically, the positive voltage is given as a micro or small voltage of about +0.3 in a state in which the source S of the n channel type MOSFET is being supplied with a circuit's ground potential like 0V.

In terms of the circuit operation, the negative voltage −V1 can be set low within such a range that the pn does not cause breakdown. However, the negative voltage is set within such a range that a backward leak current produced in the pn presents no problem, to achieve such low power consumption as to be described later. When a gate length of a MOSFET is 0.2 μm, for example, the negative voltage is set to about −1.5V, whereas when the gate length is 0.12 μm, it is set to about −1.0V. A description will be made below of a case in which a MOSFET scaled down in gate length as in the case where the gate length is given as 0.12 μm, is used, as an illustrative example.

According to the back bias setting method of the invention of the present application, wherein the substrate bias voltage is changed as given as +V2 and −V1 as described above, a change width of the threshold voltage Vt of the n channel type MOSFET can be set high as given as Vt2 and Vt12 in the characteristic diagram shown in FIG. 2. On the other hand, the change width of the threshold voltage Vt of the n channel type MOSFET at the time that the substrate bias voltage is changed as given as 0V and −V1 as described in the above publications, for example, is reduced like Vt2 and Vt11.

In order to make it easy to understand the back bias setting method according to the present invention, a threshold voltage Vt2 in a state in which the bias voltage of +V2 is being applied, is shown in FIG. 2 so as to become equal to the threshold voltage Vt2 at the time that the conventional bias voltage of 0V is applied. Namely, the MOSFET according to the present invention means that the threshold voltage Vt at the time that the bias voltage is set to 0V, so-called true threshold voltage is formed so as to be higher than the threshold voltage Vt2 of MOSFET to which the conventional bias voltage of 0V is applied.

Figure 3:
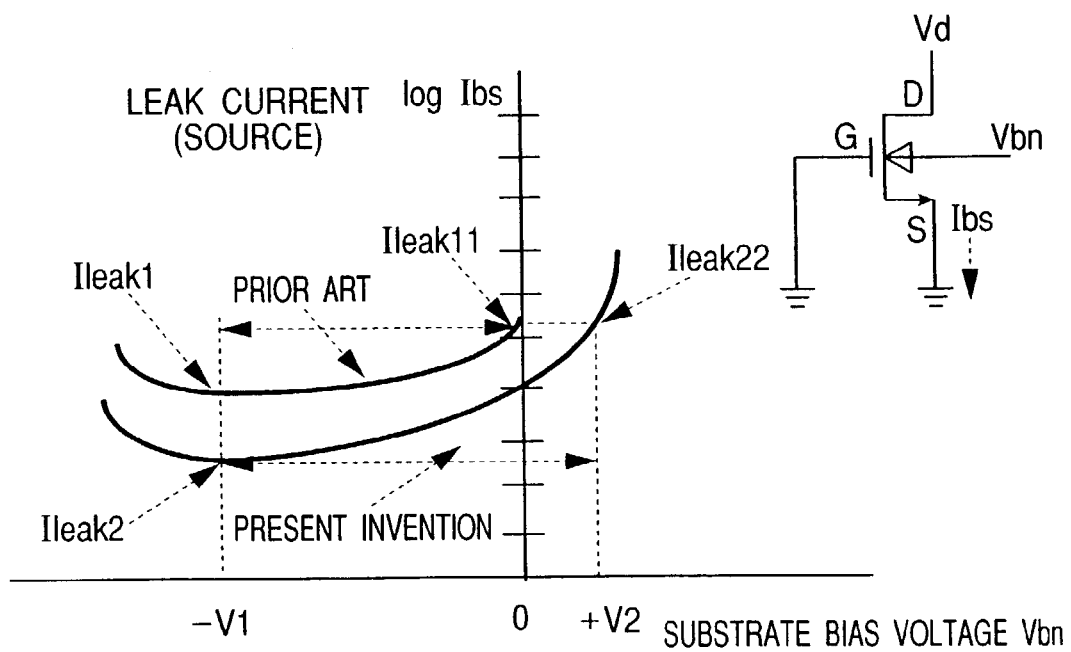
FIG. 3 is a characteristic diagram for describing the relationship between a substrate bias voltage Vbn and a drain-to-source leak current Ibs with the n channel type MOSFET as an example.

A characteristic diagram for describing the relationship between a substrate bias voltage Vbn and a drain-to-source leak current Ibs with the n channel type MOSFET as an example is shown in FIG. 3. Namely, the gate G and source S of the n channel type MOSFET shown in the same drawing are respectively brought into a state in which 0V like the circuit's ground potential is being applied thereto. The relationship between the substrate bias voltage Vbn and the leak current Ibs flowing through the source is shown.

When a positive voltage like +V2 is applied as the substrate bias voltage Vbn supplied to the n channel type MOSFET in the above-described state, a leak current Ileak22 flows. Further, the substrate bias voltage is reduced two digits or more as in the case of a leak current Ileak2 at the time that a negative voltage like −V1 is applied. On the other hand, in a MOSFET in which a leak current Ileak11 at the time that the substrate bias voltage is set to 0V as in the prior art, is matched with the above leak current Ileak22, a leak current flowing when the same negative voltage V1 is applied, is reduced about one digit alone as in the case of a leak current Ileak1. Thus, when compared in the state in which the same negative voltage V1 is applied, the difference between the leak current Ileak2 set by the above-described bias setting method according to the present invention and the leak current Ileak1 set by the conventional bias switching or changeover is extensively improved over one digit or more.

The characteristic diagram shown in FIG. 3 also shows a limit of a negative-direction voltage of a back bias voltage Vbn supplied to an n channel type MOSFET of a MOS circuit operated at a positive voltage. Namely, when the negative voltage −V1 is raised on an absolute-value basis, the threshold voltage increases and a so-called threshold leak current that flows between the drain and source, is reduced correspondingly. On the other hand, a leak current developed in pn between the source and the substrate or well region increases. Therefore, the increase in the leak current produced in such pn exceeds the reduction in the threshold leak current. Thus, when the back bias voltage Vbn exceeds a predetermined voltage and increases, the leak current Ibs increases. It has been found out by the present inventors that the optimum voltage value of the predetermined voltage (−V1) is about −1V when the MOSFET scaled down in the above-described manner is used.

The leak current Ibs of the MOSFET as described above indicates one obtained by adding the threshold leak current that flows between the drain and source of the MOSFET and the leak current that flows in pn between the source of the MOSFET and the substrate or well. A leak current, which falls within a range between the back bias voltages +V2 and −V1, makes up the majority of the threshold leak current. When the bias voltage Vbs is placed in a voltage region lower than the voltage −V1, the leak current produced in pn makes up the most part as described above and hence about −1V becomes most suitable as described above. When the substrate back bias voltage Vbn is set higher than the voltage +V2, the threshold leak current increases and exceeds a forward bias voltage (about 0.6V) of pn, a large forward current flows out in pn and hence the normal operation of the MOS circuit cannot be performed. Thus, the voltage value of the positive voltage +V2 is limited to about +0.3V in consideration of the influence of noise produced in a grounding line or conductor upon the circuit operation and even the latch up of a CMOS circuit.

While the above description has been made with the n channel type MOSFET as an example, the p channel type MOSFET is also similar to it. However, since an operating voltage Vdd is supplied to the source in the case of the p channel type MOSFET, a description will be made with such an operating voltage Vdd as a reference. A weak forward voltage like Vdd−0.3V corresponding to the bias voltage +V2 in the case of the n channel type MOSFET, and a reverse bias voltage like Vdd+1.0V corresponding to the bias voltage −V1 in the case of the n channel type MOSFET are applied to an n type substrate or a well region on which the p channel type MOSFET is formed.

An operating speed of a digital circuit comprised of a CMOS circuit is made fast in proportion to an operating current that flows into an MOSFET placed in an ON state. The current that flows in the MOSFET, increases in inverse proportion to the threshold voltage if a gate voltage supplied to the gate, i.e., the operating voltage of the CMOS circuit is constant. Thus, it is advantageous to set the threshold voltage of the MOSFET as small as possible for the purpose of achievement in a high-speed operation. However, a leak current that flows in the MOSFET placed in an OFF state, also increases in inverse proportion to the threshold voltage. As a result, the speeding up of the CMOS digital circuit means that even when it is kept in a non-operated state, current consumption will occur due to the increase in the leak current. Since a portable electronic device is predicated on being battery-driven, the leak current limits a substantial operating time.

Therefore, an attempt to change the threshold voltage in association with a circuit state has heretofore been made. A change in the conventional back bias voltage is made by performing only switching between 0V and a weak bias voltage like +ΔV (small positive voltage) and between 0V and a reverse bias voltage like −V (negative voltage) with 0V as the reference in either case. Therefore, even in the case of the switching between 0V and −V, the change width of the threshold voltage is small as shown in FIG. 2 and thereby the difference between leak currents at the circuit's operation and non-operation results in one digit at most as shown in FIG. 3.

The invention of the present application is intended to perform the following contrivances for the purpose of making the high-speed operation and low power consumption of the digital circuit compatible. According to the present invention, when a voltage corresponding to an ON state is applied to the gate of the MOSFET in a state in which a weak forward bias voltage of +V2 corresponding to such about +0.3V as not to influence the circuit operation is being applied to pn between the source of the MOSFET and the substrate (or well region), the intrinsic threshold voltage of the MOSFET is set so that a drain current is brought to a desired current value. Namely, upon design of a device structure, the intrinsic threshold voltage placed under the assumption that a potential identical to the source is applied to the substrate (or well region), is formed high. Further, a device size (principally channel length), a semiconductor impurity concentration (principally, substrate or well), and the thickness of a gate insulating film for the MOSFET are formed in such a manner that the drain current flowing at this time is also smaller than a desired drain current required in the circuit-operated state.

Thus, the intrinsic threshold voltage determined by the device structure of MOSFET is formed high as compared with an effective threshold voltage required upon an actual circuit operation. When it is desired to cause the CMOS circuit to perform its circuit operation, such a small positive voltage +V2 that pn between the source of the MOSFET and the substrate (or well region) may be brought to a weak forward bias voltage, is applied. Further, its substrate effect is used to reduce the effective threshold voltage on a software basis based on, so to say, circuitry means, thereby obtaining a drain current necessary for the speeding up of the circuit operation.

When no circuit operation is done by the CMOS circuit, i.e., when an input signal remains unchanged, either the n channel type MOSFET or the p channel type MOSFET is brought to an off state. Therefore, no dc current would theoretically flow between the operating voltage and the circuit's ground potential. However, a tailing current or a subthreshold leak current is produced between the drain and source of the MOSFET kept in the OFF state, which in turn is used up or consumed as a dc current through the ON-state MOSFET.

The present invention is intended to, when the digital circuit is in the deactivated state as described above, apply such a negative voltage −V1 that pn between the source of the MOSFET and the substrate (or well region) may be brought to a reverse bias voltage, and increase the effective threshold voltage through the use of its substrate effect on the software basis based on, so to say, the circuitry means, thereby reducing the leak current. Incidentally, the leak current can greatly be reduced one digit or more as compared with the conventional method for performing voltage switching within a range of 0V to −V1 as shown in FIG. 3.

It is to be noted that the simply switching of the substrate bias voltage to the weak forward bias voltage +V2 and the back bias voltage −V1 is not connected directly with a drastic reduction in the above-described leak current. Namely, the back bias setting method according to the invention of the present application will not miss that the intrinsic threshold voltage at the time that the source and the substrate are rendered identical in potential so that the effective threshold voltage in the weak forward bias state is brought to the threshold voltage necessary for the circuit operation, is formed greater.

It is also to be noted that the formation of the intrinsic threshold voltage greater as described above yields another advantage. When the operating voltage Vdd is reduced to achieve low power consumption, the level of the voltage supplied to the gate of the MOSFET is also reduced. It is thus possible to form thick the gate insulating film of the MOSFET at the time that a desired operating current, in other words, a desired operating speed is ensured, and to improve the reliability of each device.

The threshold-voltage characteristic diagram shown in FIG. 2 also exhibits another one. Namely, it shows that the substrate bias voltage can take a potential (0V) for causing the source and the substrate or well region to be identical in potential, in addition to the weak forward bias voltage like +V1 and the back bias voltage like −V1, and three types of threshold voltages can be set correspondingly.

As signal processes executed by the digital circuit, may be mentioned, one which needs such a high-speed process as to determine the whole signal processing rate or speed, and one of a type wherein such a relatively low-speed process that it is subsidiarily done and as not to influence the whole processing speed so far will be enough. Accordingly, the weak forward bias voltage like +V2 is supplied to a MOSFET of each circuit block for performing the high-speed process. As compared with it, 0V may be supplied to a MOSFET of each circuit block of such a type that the relatively low-speed process will be enough, when it is held in an operating state. Alternatively, a back bias voltage like −V1 may be supplied to each MOSFET which constitutes a memory circuit or the like used to simply hold data.

Undershoot and overshoot exceeding an operating voltage are produced in an input signal supplied from an external terminal to an input/output circuit of a semiconductor integrated circuit device due to parasitic inductance components of a wiring formed on a printed circuit board, a bonding wire or the like of the semiconductor integrated circuit device. Thus, the CMOS circuit has the potential of causing latch up due to the undershoot and overshoot and a parasitic thyristor device of the CMOS circuit. It is therefore desirable that a fixed voltage corresponding to 0V or a source voltage is supplied to the substrate or well in the case of MOSFETs that constitute an input circuit for receiving the input signal supplied from the external terminal, and an output circuit for transmitting an output signal to the external terminal.

Thus, the digital circuit is divided into circuits according to the signal processing speed and operating conditions required of them. For each circuit, the threshold voltage may be selected from the three types of threshold voltages in combination in association with the respective circuits and circuit operating states, or any of them may be fixed. A MOSFET constituting one circuit may be switched to the three types of threshold voltages, in other words, it may be switched to three types on a time basis like +V2, 0V and −V1 referred to above.

Figure 4:
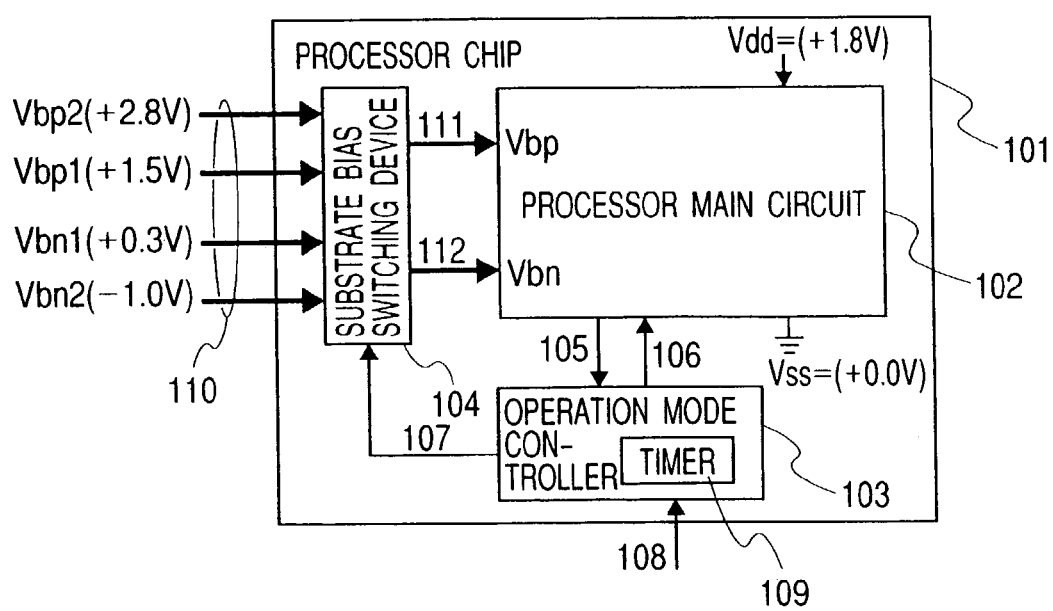
FIG. 4 is a block diagram showing a first embodiment of a processor chip to which the present invention is applied.

A block diagram showing a first embodiment of a processor chip to which the present invention is applied, is shown in FIG. 4. In FIG. 4, a processor chip 101 is an LSI chip having a circuit of a CMOS structure, which includes a processor main circuit 102, an operation mode controller 103, and a substrate bias switching device 104. The substrate bias switching device 104 receives therein a bias voltage 110 comprised of substrate bias voltages Vbp1 and Vbp2 for a p channel type MOSFET, and substrate bias voltages Vbn1 and Vbn2 for an n channel type MOSFET, outputs a bias voltage 111 for the p channel type MOSFET and a bias voltage 112 for the n channel type MOSFET, and transmits them to a bias voltage Vbp for a p channel type MOSFET of the processor main circuit 102 and a bias voltage Vbn for an n channel MOSFET thereof.

When the processor main circuit 102 is in a normal mode, the substrate bias switching device 104 sets the bias voltage Vbp for the p channel type MOSFET to Vbp1 and sets the bias voltage Vbn for the n channel type MOSFET to Vbn1. When the processor main circuit 102 is in a standby mode, the substrate bias switching device 104 sets the bias voltage Vbp for the p channel type MOSFET to Vbp2 and sets the bias voltage Vbn for the n channel type MOSFET to Vbn2. The substrate bias switching device 104 performs switching control corresponding to the operation mode and standby mode in accordance with a signal 107 outputted from the operation mode controller.

When the processor main circuit 102 is operated at such +1.8V and a ground voltage like 0V as given as an operating voltage Vdd of the processor main circuit 102, the bias voltage Vbp1 for the p channel type MOSFET is set to +1.5V, and the bias voltage Vbp2 is set to +2.8V. Thus, the source of the p channel type MOSFET is supplied with the operating voltage Vdd like 1.8V referred to above. The substrate bias voltage Vbp is set to +1.5V in a circuit's operating state. A weak forward bias voltage of +0.3V is applied to pn between a source and a substrate (or well region). When the circuit is in a standby state, the substrate bias voltage Vbp is set to +2.8V, and a back bias voltage of −1.0V is applied to pn between the source and the substrate (or well region).

The bias voltage Vbn1 for the n channel type MOSFET is set to +0.3V, and the bias voltage Vbp2 is set to − 1.0V. Namely, the source of the n channel type MOSFET is supplied with the operating voltage like 0V referred to above. The substrate bias voltage Vbn is set to +0.3V in the circuit's operating state. Thus, a weak forward bias voltage of +0.3V is applied to pn between the source and the substrate (or well region). When the circuit is in the standby state, the substrate bias voltage Vbn is set to −1.0V, and a back bias voltage of −1.0V is applied to pn between the source and the substrate (or well region).

Thus, when the processor main circuit 102 is in the normal operation mode for performing signal processing, pn between the sources of the n channel type MOSFET and the p channel type MOSFET and a well are brought to a weak forward bias state, and hence they are operated at low threshold voltages, respectively. Therefore, a large signal current flows to thereby allow the execution of a high-speed signal processing operation. When the processor main circuit 102 is in the standby mode free of any signal processing operation, pn between the sources of the n channel type MOSFET and the p channel type MOSFET and the well are brought to a back bias state, and hence they are brought into a high threshold voltage state, respectively. As a result, a threshold leak current that flows in each MOSFET kept in its OFF state, is suddenly reduced, so that current consumption in such a standby mode can greatly be reduced.

Incidentally, as will be described later, a well 302 with the processor main circuit 102 formed thereon is discretely formed independent of a well with the substrate bias switching device 104 and operation mode controller formed thereon.

Figure 5:
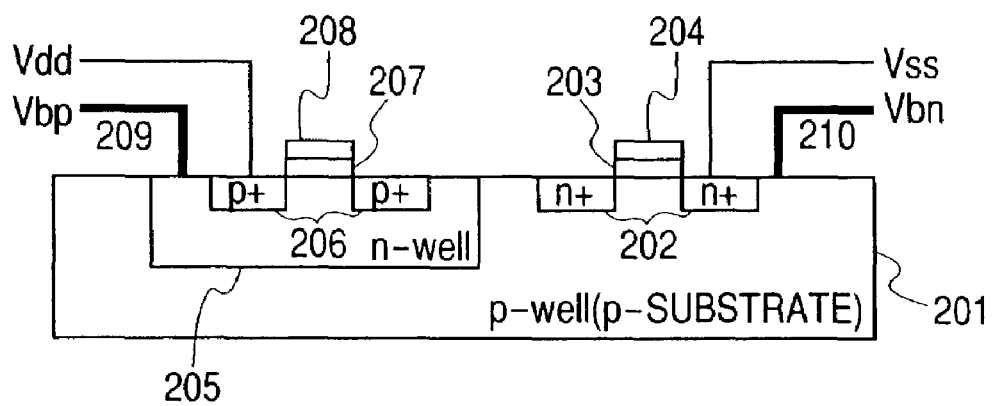
FIG. 5 is a schematic cross-sectional view of a device structure showing a first embodiment of a semiconductor integrated circuit device like the processor chip shown in FIG. 4 to which the present invention is applied.
Figure 6:
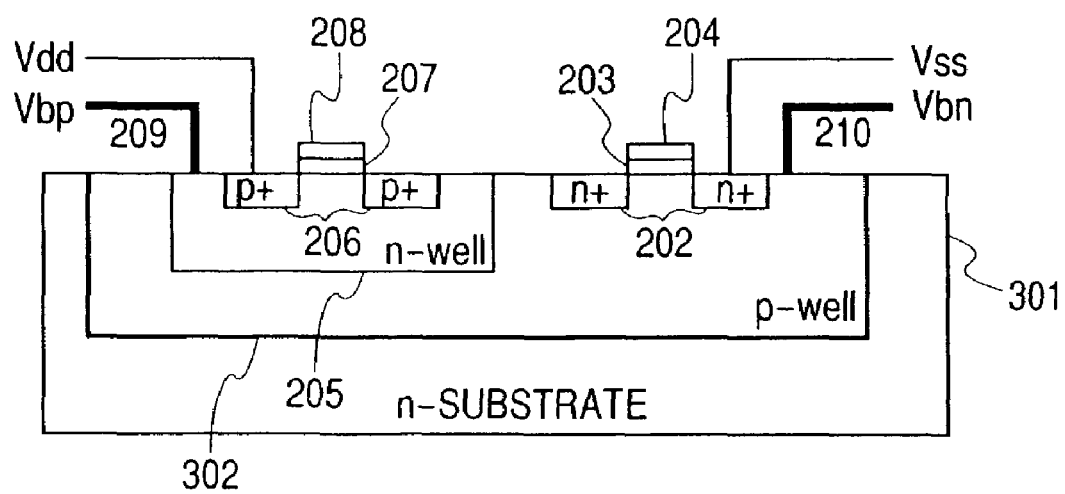
FIG. 6 is a schematic cross-sectional view of a device structure showing the first embodiment of the semiconductor integrated circuit device like the processor chip shown in FIG. 4 to which the present invention is applied.

Schematic cross-sectional views of device structures each showing a first embodiment of a semiconductor integrated circuit device like the processor chip 101, to which the present invention is applied, are respectively shown in FIGS. 5 and 6. In FIG. 5, an n channel type MOSFET comprises an n type source and drain 202 formed in a p type substrate 201, a gate insulating film 203 formed over a semiconductor region surface interposed between the source and drain 202, and a gate electrode 204 formed over the gate insulating film 203. On the other hand, a p channel type MOSFET comprises a p type source and drain 206 formed in an n type well region 205 formed in the p type substrate 201, a gate insulating film 207 formed over a semiconductor region surface interposed between the source and drain 206, and a gate electrode 208 formed over the gate insulating film 207.

FIG. 6 is different from FIG. 5 in that a p well 302 is formed in an n type substrate 301, and an n well 205 is formed in part of the surface thereof, i.e., a device having a triple well structure is formed. An n channel type MOSFET is formed in the surface of the p well 302 and a p channel type MOSFET is formed in the surface of the n well 205 to thereby constitute a CMOS circuit. FIG. 6 is similar to FIG. 5 in that as terminals for supplying substrate biases, the n well 205 of the p channel type MOSFET is provided with Vbp209 and the p well 302 of the n channel type MOSFET is provided with Vbn 210.

In the present embodiment, the processor main circuit 102 is formed within the p well 302 different from the operation mode controller 103 and the substrate bias switching device 104. Thus, the influence of substrate bias control is effected on the processor main circuit 102 alone, and hence the operation mode controller 103 and substrate bias switching device 104 can avoid its influence. Schematic cross-sectional views of device structures each showing a second embodiment of a semiconductor integrated circuit device like the processor chip 101, to which the present invention is applied, are respectively shown in FIGS. 7 and 8. In the present embodiment, an SOI structure is used. Namely, an insulating layer (oxide) is formed in the surface of a semiconductor substrate, and a p type well region and an n type well region are formed in the surface of the insulating layer, thereby forming an n channel type MOSFET and a p channel type MOSFET in a manner similar to the above. Back bias voltage terminals Vbn and Vbp are respectively provided within the p type well region and the n type well region.

Figure 7:
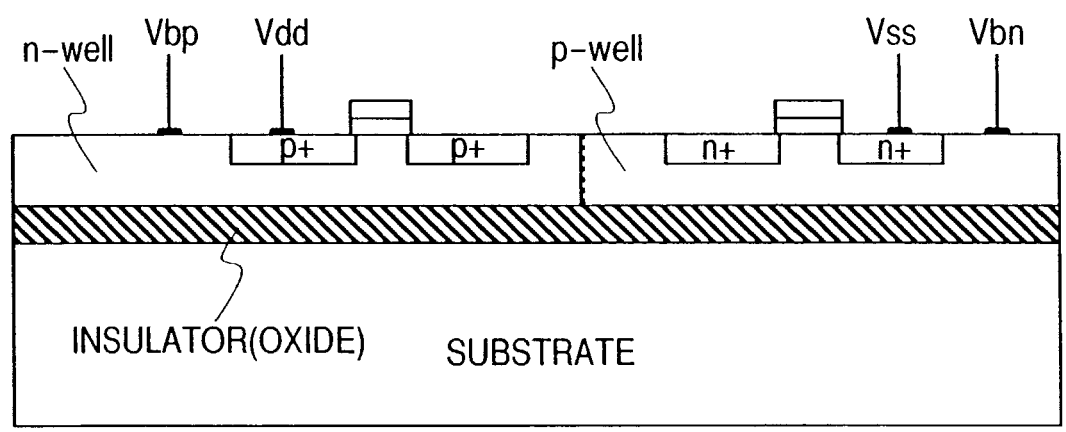
FIG. 7 is a schematic cross-sectional view of a device structure showing a second embodiment of a semiconductor integrated circuit device like the processor chip shown in FIG. 4 to which the present invention is applied.
Figure 8:
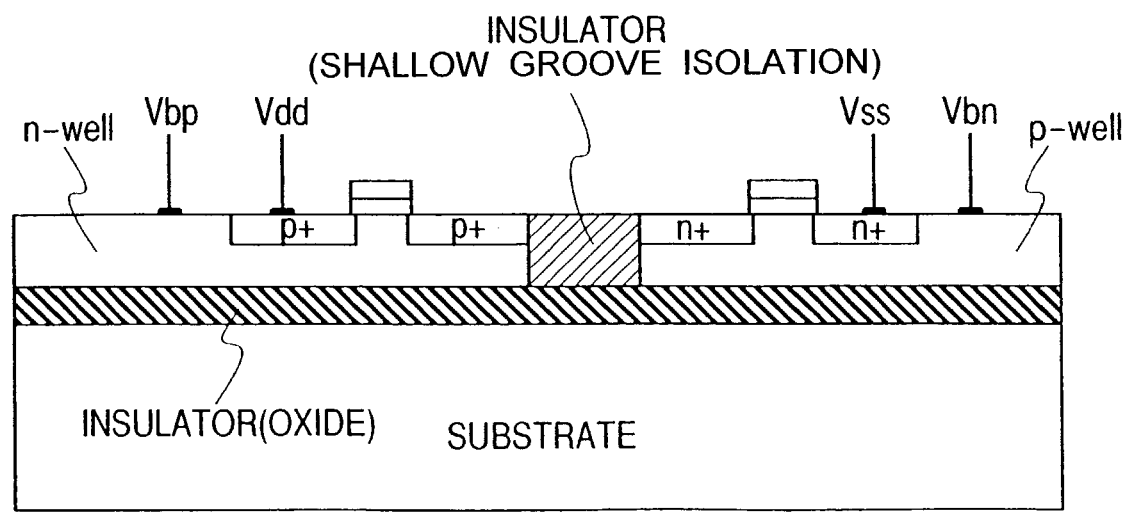
FIG. 8 is a schematic cross-sectional view of a device structure illustrating the second embodiment of he semiconductor integrated circuit device like the processor chip shown in FIG. 4 to which the present invention is applied.

FIG. 8 is different from FIG. 7 in that a shallow groove isolation or insulator is formed between the p type well region and the n type well region, and an n channel type MOSFET portion and a p channel type MOSFET portion are perfectly electrically isolated from each other. Thus, since no parasitic thyristor device is formed when the n channel type MOSFET portion and the p channel type MOSFET portion are perfectly isolated from each other, particular latch-up measures can be made unnecessary. When the SOI structure is adopted, the parasitic capacitance as viewed from each of the back bias voltage terminals Vbn and Vbp provided within the p type well region and the n type well region is reduced, and hence the load placed upon such back bias voltage switching as described above can be reduced.

Figure 9:
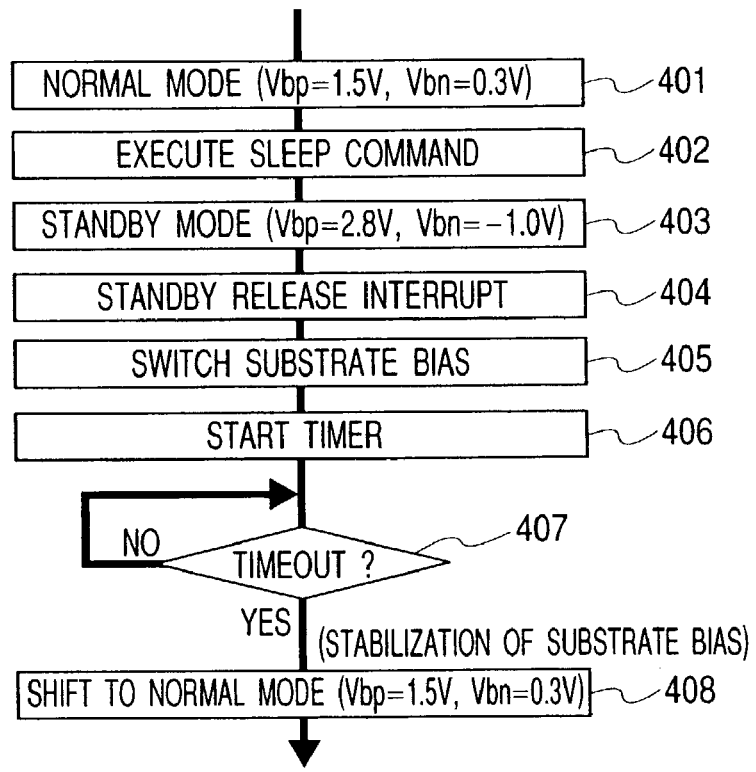
FIG. 9 is a flowchart for describing one example of a substrate bias switching operation of the processor chip shown in FIG. 4 to which the present invention is applied.

FIG. 9 is a flowchart for describing one example a substrate bias switching operation of the processor chip 101 shown in FIG. 4, to which the present invention is applied. In the processor chip 101 according to the present embodiment, operation modes for the processor main circuit 102 include a normal mode for executing a normal command and a standby mode in which the execution of a command is not performed. The same drawing shows a process on the processor chip 101 where the operation mode transitions from the normal mode to the standby mode and from the standby mode to the normal mode.

First of all, the processor main circuit 102 is operated in the normal mode. At this time, the substrate bias switching device 104 selects Vbp1 and Vbn1 for the substrate biases Vbp111 and Vbn112 respectively. The voltage values of the substrate biases for the normal mode in the present embodiment are given as Vbp1=1.5V and Vbn1=+0.3V (Step 401).

When a sleep command is executed, the processor main circuit 102 bears a "standby request" on a signal 105 and outputs it therefrom, and transfers it to the operation mode controller 103. Thereafter, the processor main circuit 102 suspends a command execution operation and proceeds to the standby mode (Step 402).

When the operation mode controller 103 has received the signal 105 from the processor main circuit, it outputs a signal 107 for switching the substrate bias of the processor main circuit 102 to a voltage for the standby mode. In response to the signal 107, the substrate bias switching device 104 selects Vbp2 and Vbn2 for the substrate biases Vbp111 and Vbn112 from an input voltage 110 and outputs them, respectively (Steps 403 and 404). In the present embodiment, the voltage values of the substrate biases for the standby mode are given as Vbp2=2.8V and Vbn2=−1.0V.

When the operation mode controller 103 detects that a "standby release interrupt" is asserted over a signal 108 from the outside (Step 405) when the processor main circuit 102 is in the standby state, the operation mode controller 103 outputs a signal 107 for switching the substrate bias of the processor main circuit 102 to a voltage for the normal mode, and the substrate bias switching device 104 switches the substrate biases Vbp111 and Vbn112 to Vbp1 (1.5V) and Vbn1 (+0.3V) respectively in response to the signal 107 (Step 406).

Since some time is taken until each substrate bias voltage is stabilized after the switching of each substrate bias, there is a possibility that when the operation of the processor main circuit 102 is restarted immediately, it will malfunction. In order to avoid it, the operation mode controller 103 causes an onchip timer 109 to set a sufficient time necessary to stabilize the switched substrate bias voltage and start prior to the selection of the operation mode of the processor main circuit 102 (Step 407) and waits for the execution of a timeout (step 408).

After the timeout, the operation mode controller 103 bears a "standby release" on a signal 106 and outputs it therefrom, and transmits it to the processor main circuit 102. In response to the signal 106, the processor main circuit 102 proceeds to the normal mode, where it resumes a command execution operation (Step 409).

The substrate biases Vbp111 and Vbn112 for the processor main circuit 102 are controlled in the above-described manner. Upon its operation, the threshold voltage of each MOSFET constituting the processor main circuit is set low to cope with a high-speed operation. Upon its standby, the threshold voltage is set high to reduce a leak current.

Figure 10:
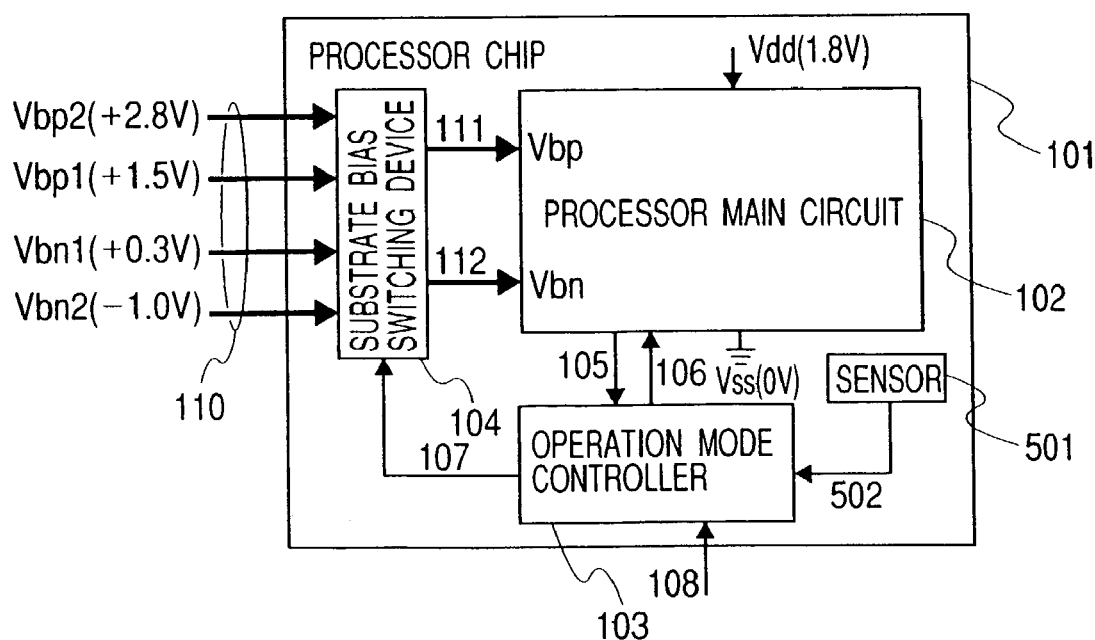
FIG. 10 is a block diagram showing a second embodiment of a processor chip according to the present invention.

A block diagram of a second embodiment of a processor chip according to the present invention is shown in FIG. 10. In the present embodiment, an operation mode controller 103 is provided with a sensor 501 for detecting a bias voltage applied to a substrate of the processor main circuit 102. When an operation mode of the processor main circuit 102 transitions from a normal mode to a standby mode, a routine procedure is identical to that shown in FIG. 9. When the operation mode thereof transitions from the standby mode to the normal mode, the operation mode controller 103 controls a substrate bias switching device 104 in a manner similar to the first embodiment to thereby switch or change each substrate bias to a voltage for the normal mode. Thereafter, the operation mode controller 103 waits until the sensor 501 outputs, in the form of a signal 502, that the switched substrate bias voltages have been stabilized at predetermined values, i.e., Vbp=1.5V and Vbn=+0.3V in the present embodiment. When the sensor 501 outputs the stability of the substrate biases as the output 502, the operation mode controller 103 outputs a "standby release" in the form of a signal 106 and resumes the operation of the processor main circuit 102.

Figure 11:
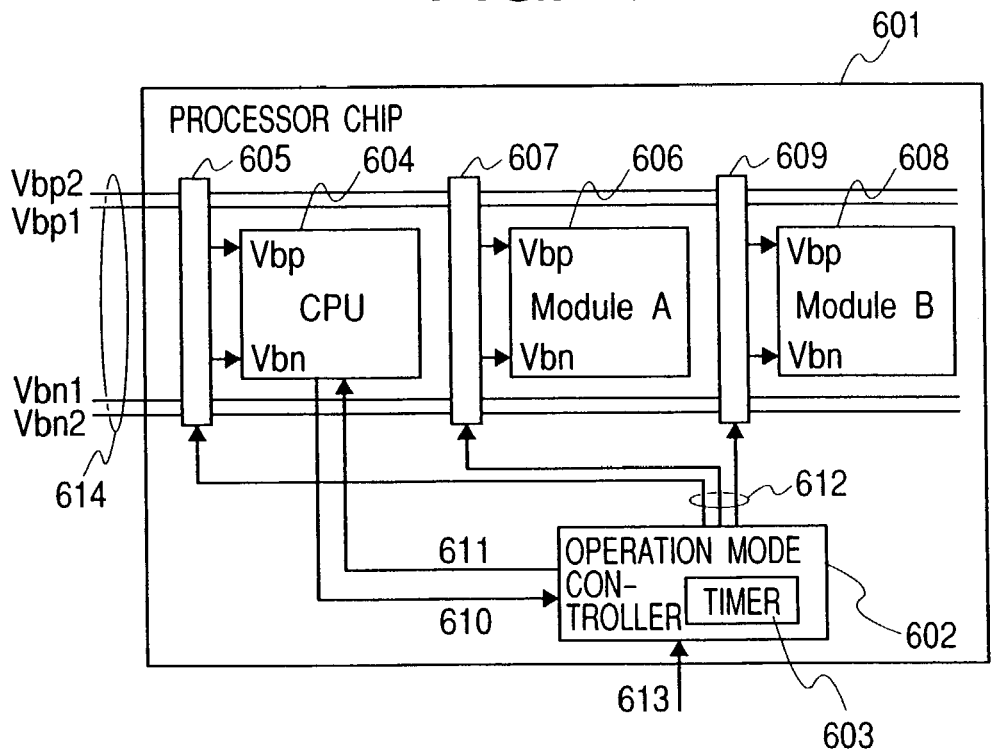
FIG. 11 is a block diagram illustrating a third embodiment of a processor chip according to the present invention.

A block diagram of a third embodiment of a processor chip according to the present invention is shown in FIG. 11. The triple well structure shown in FIG. 6 or the SOI structures shown in FIGS. 7 and 8 is considered as a basic device structure of a processor chip 601. In the processor chip 601 shown in FIG. 11, a processor main circuit comprises a plurality of function modules like a CPU 604, a module A606 and a module B608. The respective function modules exist on different well regions so as to be separated from one another and is placed under the uninfluence of substrate bias control of other function modules.

Each of the function modules includes ones given in smaller units such as a CPU, an FPU, a cache, or a computing unit, etc. Substrate bias switching devices 605, 607 and 609 are respectively provided in association with the respective function modules 604, 606 and 608 and respectively perform switching between substrate biases for the corresponding function modules in a manner similar to the above-described embodiment. The execution of a command is made with the CPU 604 corresponding to one of the function modules as the center. When a command for causing a function module unnecessary for the execution thereof to stand by is executed, the standby for the function module is transferred to an operation mode controller 602.

The operation of the processor chip 601 according to the present embodiment will next be explained. Let's assume that all the function modules are first operated in a normal mode. When the CPU 604 executes a command for causing the module A to stand by, it bears this standby request on a signal 610 and outputs it therefrom. Thus, the present module is unavailable until the module A606 is released from standing by subsequently.

In response to the signal 610, the operation mode controller 602 outputs a signal 612 to the substrate bias switching device 607 to switch each substrate bias for the module A606 to a voltage for a standby mode. When the operation mode controller 602 receives a signal for standby release of the module A606 from the output signal of the CPU 604 or an external signal 613 supplied to the processor chip 601 when the module A606 is placed in a standby state, the operation mode controller 602 outputs the signal 612 to the substrate bias switching device 607 and switches the substrate bias for the module A to a voltage for the normal mode. The operation mode control 602 waits for the stabilization of each switched substrate bias voltage through the use of an onchip timer 603 in a manner similar to the first embodiment of the present invention shown in FIG. 4 and notifies the release of the module A from standby to the CPU 604 through its stabilization. When the CPU 604 receives the signal 611 therein, it is capable of executing a command using the module A.

Standby control on the module B608 and other function modules is similar to the above. Further, the CPU 604 per se is also an object to be subjected to the standby control. When, in this case, the CPU 604 proceeds to a standby mode, it suspends the execution of all commands. When the external signal 613 causes a signal for the release of the CPU 604 from standby to be asserted, the operation mode controller 602 causes the signal 611 to be asserted for the release of the CPU 604 from standby after the switching to each substrate bias of the CPU 604 has been completed. It is controlled in a manner similar to the case of the module A606 except that the execution of the command by the CPU 604 is resumed. The standby control in the function module units employed in the present embodiment allows a reduction in leak current of each function module unnecessary upon the operation of the processor.

Figure 12:
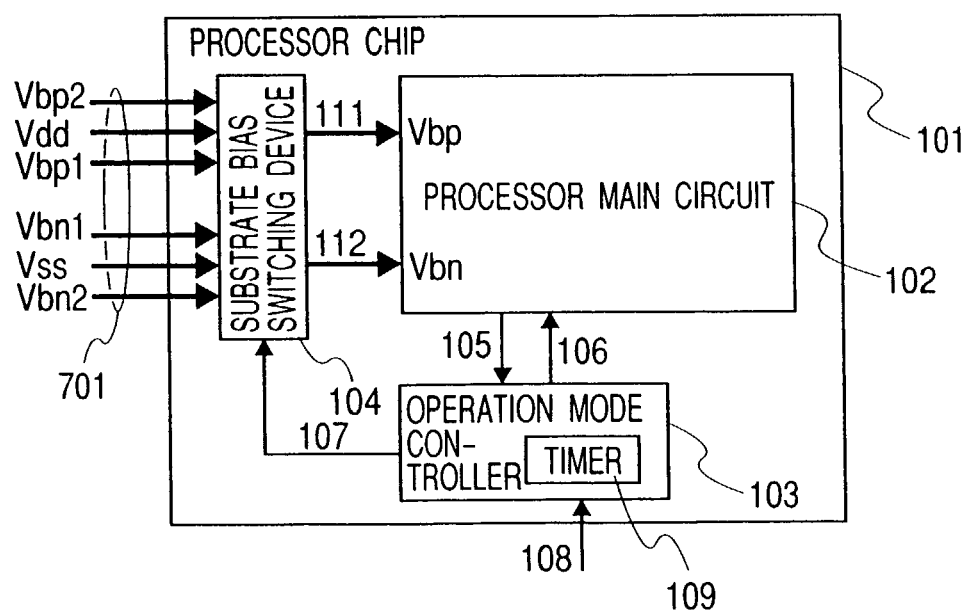
FIG. 12 is a block diagram depicting a fourth embodiment of a processor chip according to the present invention.

A block diagram of a fourth embodiment of a processor chip according to the present invention is shown in FIG. 12. The present embodiment is different from the first embodiment shown in FIG. 4 in that the types of voltages 701 supplied from the outside to a substrate bias switching device 104 increase, and the substrate bias switching device 104 is capable of selecting suitable ones from those as substrate biases and applying the same to a processor main circuit 102. The present embodiment is provided with means for dynamically changing an operating speed of a processor main circuit 102, i.e., its operating frequency according to a command. Operation modes of the processor main circuit 102 include a high-speed mode and a low-speed mode.

In the present embodiment, Vbp1 (for PMOS) and Vbn1 (for NMOS) are selected as substrate biases corresponding to the high-speed mode, Vdd (for PMOS) and Vss (for NMOS) are selected as substrate biases corresponding to the low-speed mode, and Vbp2 (for PMOS) and Vbn2 (for NMOS) are selected as substrate biases corresponding to a standby mode. For example, the substrate biases for the high-speed mode are Vbp1=1.5V, Vbn1=+0.3V, the substrate biases for the low-speed mode are Vdd=1.8V and Vss=0V, and the substrate biases for the standby mode are Vbp2=2.8V and Vbn2=−1.0V.

The operation of the processor chip 101 according to the present embodiment will next be described. Now consider where the operation mode of the processor main circuit 102 is changed from the high-speed mode to the low-speed mode. While the processor main circuit 102 is being operated in the high-speed mode, the substrate bias switching device 104 selects Vbp1 (1.5V) for Vbp111 as the substrate bias of the processor main circuit and selects Vbn1 (+0.3V) for Vbn112 as the substrate bias. When a command for transition to the low-speed mode is executed by the processor main circuit 102, the processor main circuit 102 bears its request on a signal 105 and outputs it therefrom to thereby interrupt a command execution operation. A clock supplied to the processor main circuit 102 is changed over to a low frequency under the execution of the command for transition to the low-speed mode. In response to the signal 105, an operation mode controller 103 outputs a signal 107 to change the substrate biases for the processor main circuit 102 to voltages for the low-speed mode. In response to the signal 107, the substrate bias switching device 104 switches the substrate biases Vbp111 and Vbn112 to Vdd (1.8V) and Vss (0V) respectively. The operation mode controller 103 waits for the stabilization of each switched substrate bias through the use of an onchip timer 109 in a manner similar to the above-described embodiment and notifies the completion of transition to the low-speed mode to the processor main circuit 102. In response to the signal 106, the processor main circuit 102 resumes the interrupted command execution operation in the low-speed mode.

Since operations at the switching from the low-speed mode to the high-speed mode, the switching from the high-speed mode or low-speed mode to the standby mode, or the switching from the standby mode to the high-speed mode or low-speed mode in the present embodiment are similar to the above, the details thereof will be omitted. In the present embodiment, the operating speed is further subdivided into parts, and substrate bias control associated therewith may be performed. As described in the third embodiment, the processor main circuit 102 is separated into the function module units through the use of the triple well structure or SOI structure for the device, and the substrate biases may be controlled according to the respective function modules in interlock with switching between their operating frequencies.

As in the present embodiment, the execution of substrate bias control suitable for each operating frequency of the processor makes it possible to reduce a leak current developed in the low-speed operation mode. Further, the present embodiment can obtain even the effect of reducing a through current at switching since the range of the input voltage in which both PMOS and NMOS transistors of the CMOS circuit are simultaneously brought into conduction in the low-speed mode, becomes narrow as compared with upon the high-speed operation mode.

Figures 13, 14:
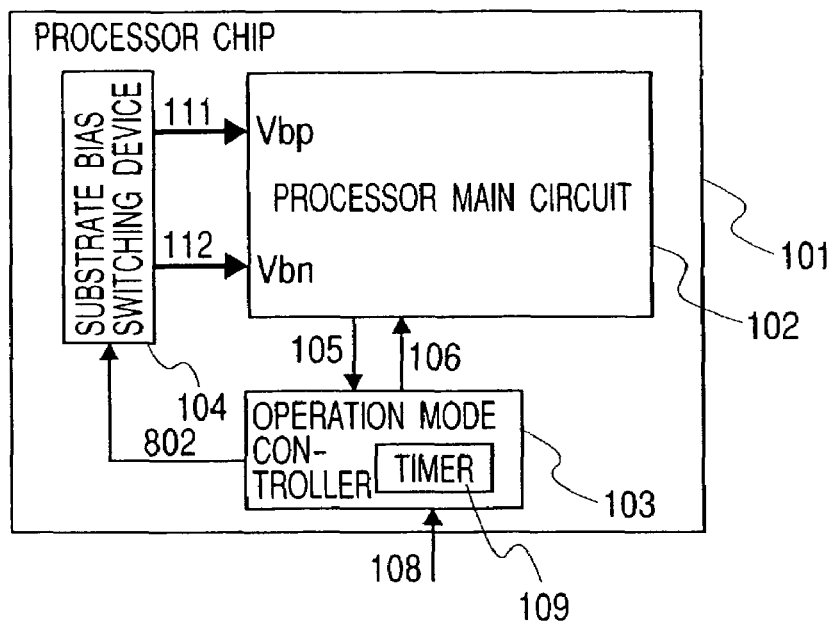
FIG. 13 is a block diagram showing a fifth embodiment of a processor chip according to the present invention.
FIG. 14 is an operation mode explanatory diagram of a microcomputer according to the present invention.

FIG. 13 is a block diagram of a fifth embodiment of a processor chip according to the present invention. The present embodiment is different from the first embodiment shown in FIG. 4 in that the substrate bias switching device comprises a substrate bias generator 801. The substrate bias generator 801 is controlled based on an output signal 802 of an operation mode controller 103 to thereby generate voltages for substrate biases thereinside and outputs the same to Vbp111 and Vbn112.

The voltage values of the substrate biases Vbp111 and Vbn112 generated in association with an operation mode of a processor main circuit 102 under the control of the operation mode controller 103 are values similar to those employed in the first embodiment. Since the operations of the processor main circuit 102 and operation mode controller 103 are similar to the first embodiment, the details thereof will be omitted. Owing to the constitution of the substrate bias switching device employed in each of the second, third and fourth embodiments by the substrate bias generator 801 in a manner similar to the present embodiment, the substrate biases can be generated inside the processor chip and changed over according to the operation modes.

According to the respective embodiments as described above, since the timing provided to re-start the processor at the transition from the standby state to the operating state can accurately be controlled through the use of the timer or sensor, the most suitable substrate bias control corresponding to the operation mode of the processor can be carried out. Thus, the leak current can be reduced in the standby mode while the high speeding-up is being held when the operation mode of the processor is given as the normal mode. Controlling the substrate biases according to the operation modes set according to the function modules allows a reduction in leak current in each function module unnecessary for execution even if the processor is in operation. Also executing the substrate bias control suitable for the operating frequency of the processor yields the effect of reducing the through current at the switching as well as reducing the leak current in the low-speed mode. As a result, a microprocessor can be provided which is capable of effectively realizing a reduction in power consumption and combines a high-speed characteristic and a low power consumption characteristic.

An embodiment of a one-chip microcomputer will be described below specifically in connection with operation modes for controlling substrate biases. Now assume that a microprocessor has two power supplies or sources of 1.8V and 3.3V and performs substrate bias control based on 1.8V alone. A circuit for supplying 1.8V may preferably be comprised of a MOS transistor having a relatively low threshold value (e.g, Vth<about 0.4V) in a state in which the back bias voltages Vbp1 and Vbn1 in the high-speed mode are being supplied.

FIG. 14 shows one example illustrative of operation modes for a microcomputer. As the operation modes, may be mentioned, a normal operation mode 982 for performing a normal operation, and a reset mode 981. As modes in which the microcomputer operates with low power consumption, may be mentioned, sleep mode 983, deep sleep mode 984, standby mode 985, hardware standby mode 986, and a RTC (Real Time Clock) battery backup mode. Further, an IDDQ measurement is used as a test mode.

Since a high-speed operation is required upon the normal operation 982, such a voltage +V2 that the source of each MOSFET and the well are brought to a weak forward bias state, is supplied as a substrate bias voltage. Since it is necessary to reset all the functions upon the rest 981, such a voltage +V2 that they are brought to the weak forward bias state, is supplied as the substrate bias voltage. In the low power consumption mode, such a voltage +V2 that they are brought to the weak forward bias state, is supplied in the sleep mode 983 and deep sleep mode 984 short in recovery time as viewed from the low power consumption mode However, such a voltage −V1 that the source of the MOSFET and the well are brought to a back bias state, is supplied in the case of the standby mode 985 and hardware standby mode 986 which places emphasis on a reduction in power consumption rather than on the recovery time.

The RTC battery backup mode is a mode for supplying only power for a RTC circuit operated at 3.3V. Since the transition to this mode is started from the low power consumption mode, such a voltage −V1 that the source and well are brought to the back bias state, is supplied. Further, since the measurement of IDDQ is a mode for measuring a standby current and measuring a through current developed due to a short-circuit and failure in transistor, it is, in this case, necessary to assuredly supply such a voltage −V1 that the source and well are brought to the back bias state to thereby reduce leak power of a chip and make it easy to find the failure.

Figures 15, 16:
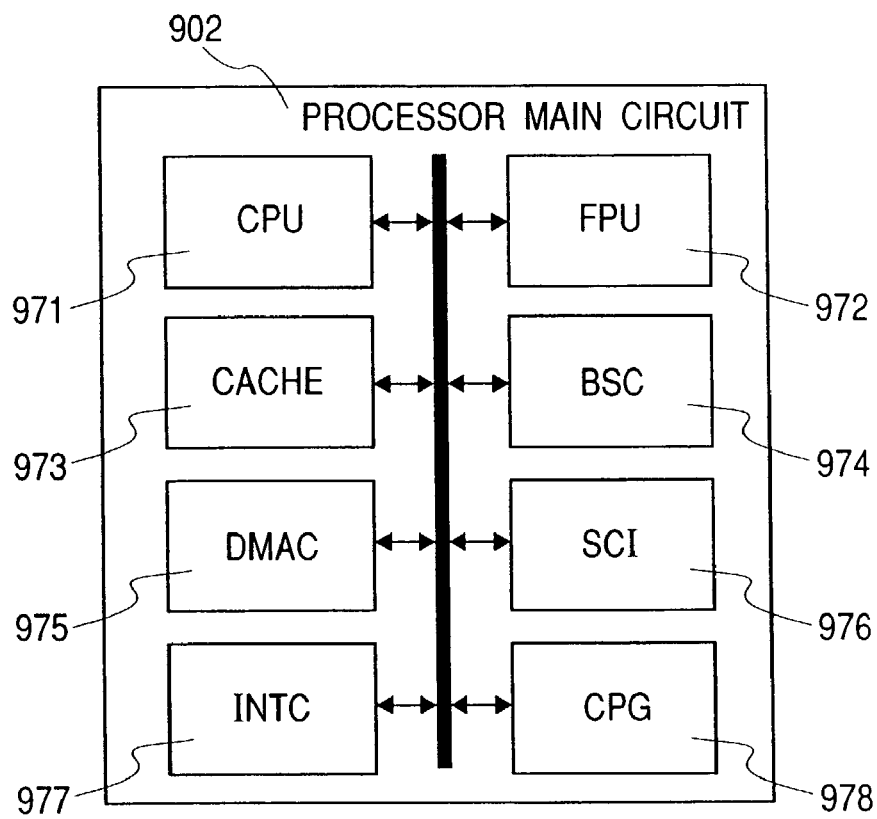
FIG. 15 is a block diagram showing one embodiment of a one-chip microcomputer according to the present invention.
FIG. 16 is a diagram showing the relationship between respective circuit blocks and operation modes for describing low power consumption modes of the one-chip microcomputer according to the present invention.

A block diagram of one embodiment of a one-chip microcomputer according to the present invention is shown in FIG. 15. Prior to the description of a low power consumption operation mode of the microcomputer according to the present invention, a description will be made of configurations of internal blocks in a processor main circuit 902. As arithmetic or computing circuits, may be mentioned, a CPU (Central Processing Unit) 971, and an FPU (Floating-Point Unit) 972. There are also provided a cache 973 used as a memory built in a chip, a BSC (Bus Controller) 974 which performs interface to an external memory, a DMAC (DMA Controller) 975 which performs a DMA (Direct Memory Access), an SCI (Serial Controller) 976 which controls a serial port, an INTC (Interrupt Controller) 977 which controls an interrupt input, a CPG (Clock Controller) 978 which controls a clock, etc.

FIG. 16 shows the relationship between respective circuit blocks and operation modes for describing low power consumption modes of the one-chip microcomputer according to the present invention. As the low power consumption modes for the one-chip microcomputer according to the present invention, may be mentioned, three types of sleep mode 983, deep sleep mode 984, and standby mode 985.

In the sleep mode 983, only clocks for the computing devices such as the CPU 971, FPU 972, cache 973, etc. are in a halt state, and such a voltage +V2 that the source and well are brought into the weak forward bias state, is supplied as the substrate bias voltage. Therefore, although power consumption cannot greatly be reduced, the transfer of DMA by the DMAC 975, and normal refreshes (1024 refreshes/16 milliseconds) of DRAM (Dynamic RAM) and SDRAM (Synchronous Dynamic RAM) by the BSC 974 can be carried out. Since the CPG 978 is in operation and such a voltage +V2 as to bring about the above-described weak forward bias state is supplied, the recovery time from the sleep mode 983 to the normal operation mode 982 is made fast. Namely, the fast response of the computing device such as the CPU 971, FPU 972, cache 973 or the like can be implemented.

Since all the operation clocks are suspended and such a voltage −V1 that the source and well are brought into the reverse bias state, is supplied as the substrate bias voltage in the standby mode 985, power consumption is extremely low. The DMA transfer cannot be performed because no clocks are supplied. It is necessary that as to the refresh of the DRAM and SDRAM, control signals (RAS signal and CAS signal) for each individual memories are set by use of the BSC 974 so that the memories enter into such a self refresh mode that they per se perform refresh, prior to entering into the standby mode 985. Since, however, the clocks are in the halt state, the recovery time from the standby mode 985 to the normal operation 982 becomes long because of standby or waiting for the stabilization of clock oscillations and the recovery time as viewed or counted from a substrate bias state.

The deep sleep mode 984 mode is a low power consumption mode placed between the sleep mode 983 and the standby mode 985. As the substrate bias voltage, such a voltage +V2 as to bring about the above-described weak forward bias state is supplied.

FIG. 17 shows the relationship between the respective circuit blocks and operation modes for describing the difference between sleep mode and deep sleep mode of the one-chip microcomputer according to the present invention. Since the BSC 973, DMAC 974 and SCI 975 being activated upon the sleep mode 983 are deactivated upon the deep sleep mode 984, power consumption can be reduced correspondingly. However, the DMA transfer cannot be performed in the deep sleep mode 984, and the refresh for each memory also enters into self refresh. A recovery time from the deep sleep mode 984 to the normal operation mode 982 is made fast in a manner similar to the sleep mode. Setting the three types of low power consumption modes in this way allows fine low power consumption control according to uses.

Figure 18:
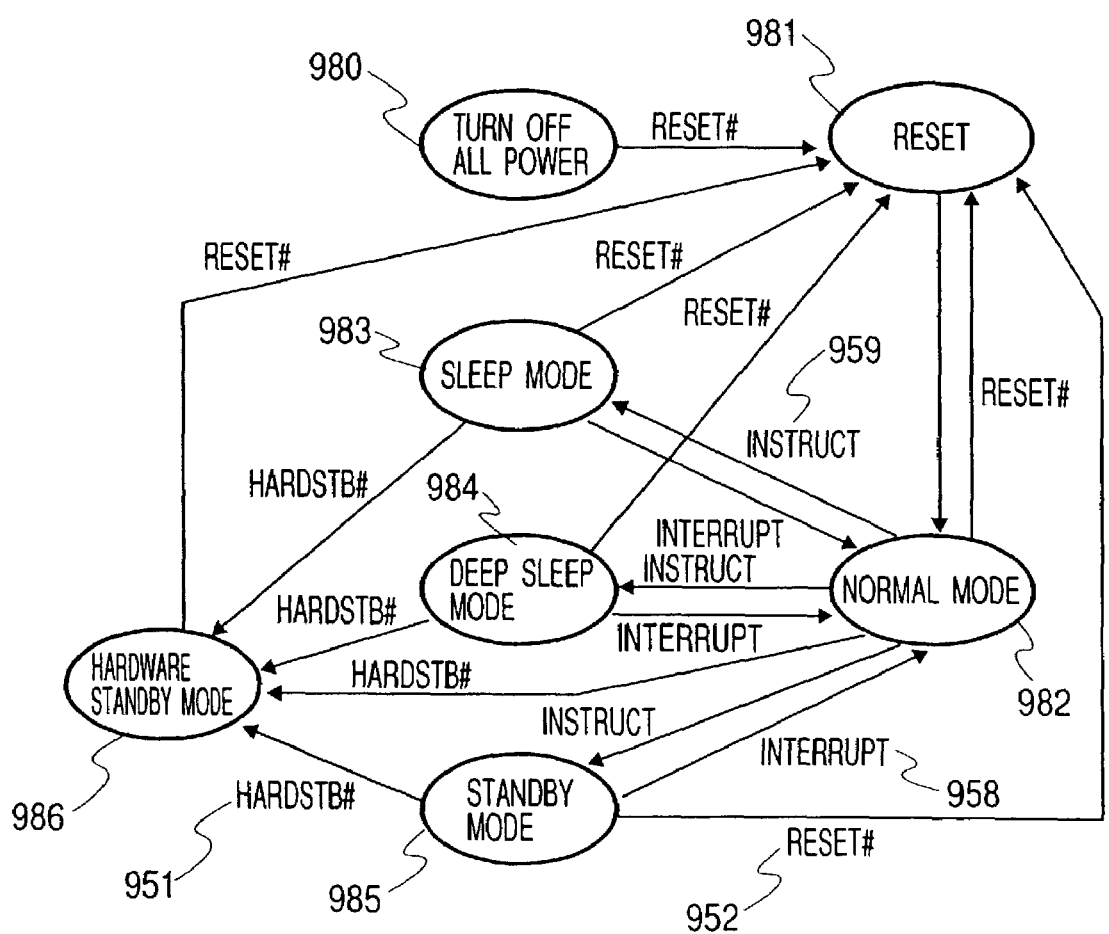
FIG. 18 is a state transition diagram showing one embodiment of the one-chip microcomputer according to the present invention.

A state transition diagram of one embodiment of the one-chip microcomputer according to the present invention is shown in FIG. 18. A processor chip transitions from an off-state 980 of all powers to a reset state 981 in response to a RESET#952 (or power-on reset) pin input. When the RESET#952 is negated, the processor chip transitions to a normal operation 982. It transitions from this state to a low consumption operation mode.

There are two transition methods. One of them is a command-based transition. This transition is made according to the execution of a sleep command by the CPU 971. When the sleep command is executed, a mode register is set to allow the selection of the sleep mode 983, deep sleep mode 984 and standby mode 985 and hence the transition to their modes is allowed. The recovery from the respective modes to the normal operation mode 982 corresponds to an interrupt 958.

Another transition method is a transition based on a HARDSTB#951 pin. When the pin is asserted, the processor chip transitions to a hardware standby state 986. This state corresponds to a state in which all the clocks are suspended and substrate bias control is also in an executed state, in a manner similar to the standby mode 985. When an input/output buffer is brought to high impedance in this mode, a 3.3V-system circuit can also avoid the action of a transistor into which a through current flows, whereby the measurement of IDDQ is allowed. If an input buffer of a RTC circuit placed in the 3.3V system is fixed, then a signal inputted to the RTC circuit is not brought to floating (intermediate level) even when power supplies other than that for the RTC circuit are turned off. It is therefore possible to prevent the RTC circuit from malfunctioning and activate only the RTC circuit.

Figure 19:
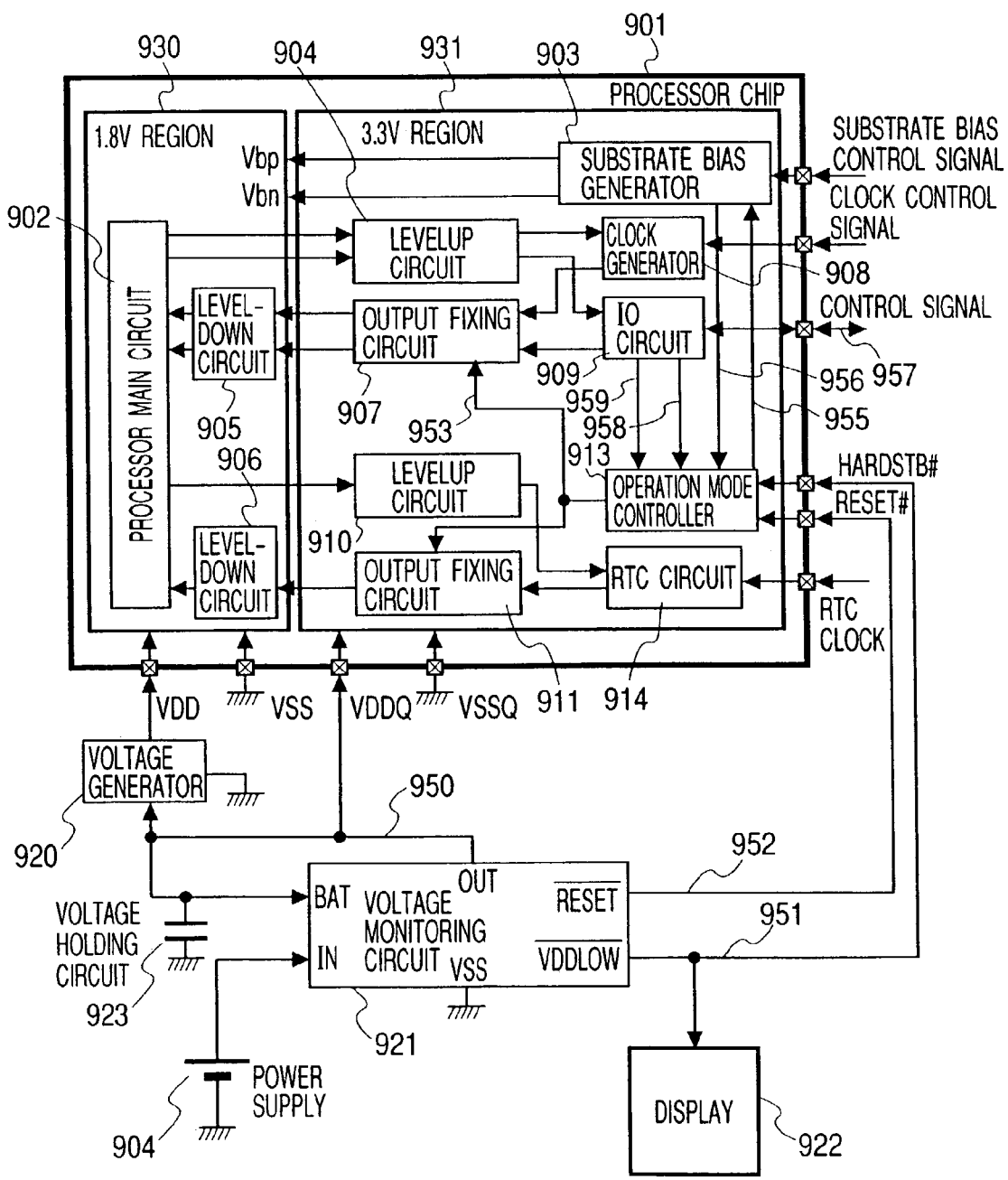
FIG. 19 is an overall block diagram illustrating one embodiment of a microcomputer according to the present invention.

An overall block diagram illustrating one embodiment of a microcomputer according to the present invention is shown in FIG. 19. The same drawing shows a configuration of a processor chip 901 wherein hardware standby applied to all to thereby allow the replacement of a power supply 904 (battery) of the processor chip 901, and a configuration of a power control circuit.

The processor chip 901 comprises a 1.8V region circuit 930 operated at 1.8V and a 3.3V region circuit 931 operated at 3.3V. The 1.8V region circuit 930 comprises a processor main circuit 902 and leveldown circuits 905 and 906 for performing level conversion of from 3.3V to 1.8V. The 3.3V region circuit 931 comprises a substrate bias generator 903, a clock generator 908, an IO circuit 909, an operation mode controller 913, a RTC circuit 914, levelup circuits 904 and 910 for respectively performing level conversion of from 1.8V to 3.3V, and output fixing circuits 907 and 911 for respectively fixing signals from 3.3V to 1.8V. The power-system control circuit includes a power supply 904, a power or voltage monitoring circuit 921, a display 922, and a voltage generator 920 for generating a 1.8V-system voltage.

The operation of the processor chip will he described below. When the processor chip 901 is in the normal operation mode 982, the substrate bias generator 903 is supplied with such bias voltages Vbp1 and Vbn1 (equivalent to +V2 referred to above) that substrate biases are brought to a weak forward bias state between the source of each MOSFET and the well in which it is formed, as described above. The clock generator 908 comprises a PLL (Phase Locked Loop) or the like. It generates a clock for each internal operation and transmits it to the processor main circuit 902 through the output fixing circuit 907 and the leveldown circuit 905.

The IO circuit 909 takes in or captures a signal from outside and sends it to the processor main circuit 902 through the output fixing circuit 907 and the leveldown circuit 905. Further, signals outputted from the processor main circuit 902 are outputted to the outside through the levelup circuit 904. The RTC circuit 914 is operated at 3.3V and receives a control signal from the processor main circuit 902 through the levelup circuit 910 and transmits a control signal to the processor main circuit 902 through the leveldown circuit 906 and the output fixing circuit 911. The operation mode controller 913 controls the substrate bias generator 903 in particular.

The voltage monitoring circuit 921 monitors the voltage level of the power supply 904. When the voltage level falls below a predetermined level (the running down of the battery is detected) it brings HARDSTB#951 to a low level. Simultaneously, the voltage monitoring circuit 921 causes the display 922 to display an alarm about the running down of the battery and notifies it to a user. Even when the voltage level is in a reduced state, the voltage holding circuit 923 is capable of holding the voltage level over a predetermined period (for a period from a few minutes to a few hours). During that period, the user is capable of replacing the power supply 904 with another.

Figure 20:
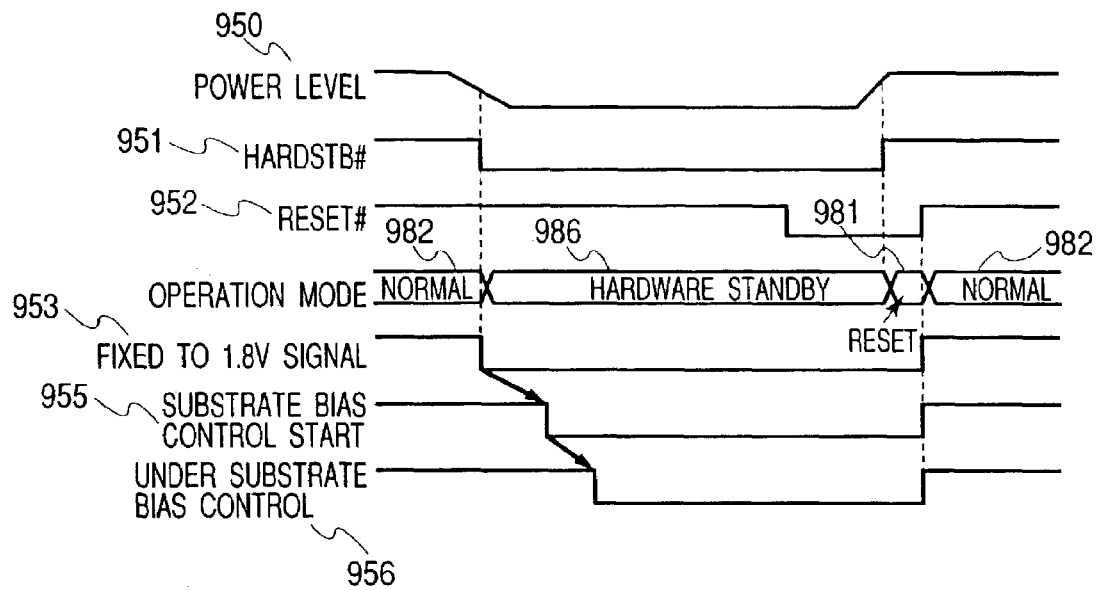
FIG. 20 is a timing diagram for describing a power exchange sequence of a microcomputer system shown in FIG. 19.

A timing diagram for describing a power exchange sequence of a microcomputer system shown in FIG. 19 is shown in FIG. 20.

(1) When the HARDSTB#951 is brought to a low level, the operation mode enters a hardware standby mode 986. Here, the operation mode controller 913 outputs a fixing 1.8V signal 953 or 1.8V signal fixing to fix a signal from 3.3V to 1.8V, and suspends a 1.8V clock too. Thus, since the 1.8V signal remains unchanged, a 1.8V-system circuit at the time that a substrate bias is drawn to or biased up to −V1, is prevented from malfunctioning.

(2) The operation mode controller 913 outputs a substrate bias control start signal 955 to the substrate bias generator 903, based on the timing for the 1.8V signal fixing 953. Between the signal fixing 953 and the substrate bias control start 955, a signal is actually fixed and a time difference up to the suspension of the supply of the signal to the 1.8V region is set. The time difference can be measured by a timer, based on a RTC clock for the RTC circuit 914.

(3) In response to the substrate bias control start signal 955, the substrate bias generator 903 starts to bias a substrate bias for a 1.8V-system substrate up to −V1. During a period in which the substrate bias is being biased or settled down, the substrate bias generator 903 feeds back a signal 956 being under substrate bias control to the operation mode controller 913.

(4) In a state in which the substrate bias is being biased up to −V1, the processor main circuit 902 is deactivated. Further, since a leak current is also less reduced, the amount of consumption of the current is small. Thus, the holding time of the voltage holding circuit 923 becomes also long.

(5) In this condition, the power supply 904 is replaced with another.

(6) Since the source voltage is returned to the normal level after its replacement, the HARDSTB#951 is returned to a high level.

(7) Thereafter, a power-on reset circuit is operated to input RESET#952 to the operation mode controller 913. According to the reset input, the substrate bias control start signal 955 outputted from the operation mode controller 913 is released.

(8) In response to the release or cancellation of the substrate bias control start signal 955, the substrate bias generator 903 starts to return the substrate bias of the 1.8V-system substrate to a potential (e.g., +V2 in the case of PMOS, Vbn1 (+0.3V) in the case of NMOS, and Vbp1 (1.5V) in the case of PMOS) indicative of an operating state. A predetermined time is required to recover the substrate bias. When the substrate bias is brought back, the signal 956 being under substrate bias control is released or cancelled, so that its release is notified to the operation mode controller 913.

(9) In response to the release of the signal 956 being under substrate bias control, the 1.8V signal fixing 953 outputted from the operation mode controller 913 is released, so that a signal is inputted to the 1.8V-system circuit such as the processor main circuit 902 or the like.

(10) After the completion of the reset state 81, the processor chip 901 enters the normal mode 982 and hence the processor main circuit 902 starts its normal operation.

By using the low power consumption mode based on the hardware standby in the above-described manner, the power supply 904 can be replaced with another.

Figure 21:
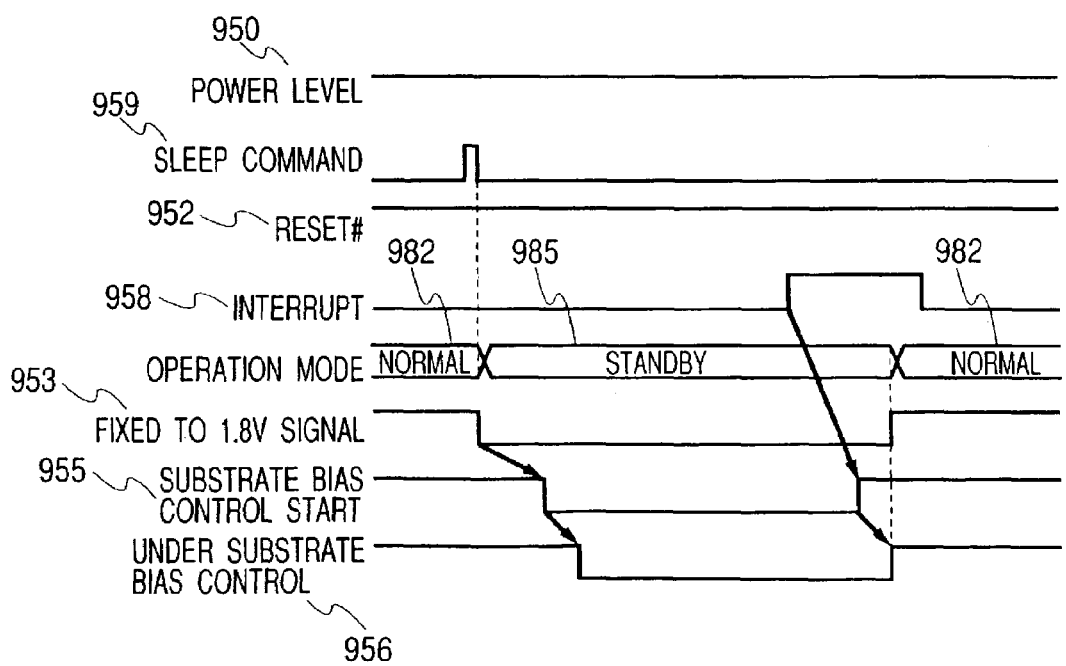
FIG. 21 is a timing diagram for describing a recovery sequence to a normal state of the microcomputer system shown in FIG. 19.

A timing diagram for describing a recovery sequence to a normal state of the microcomputer system shown in FIG. 19 is shown in FIG. 21. The same drawing shows an example in which an operation mode enters a standby mode 985 through the use of a normal sleep command 959, and the operation mode is recovered to a normal mode 982 according to an interrupt signal 958.

(1) According to a sleep command 959, the operation mode enters the standby mode 985. Here, the operation mode controller 913 outputs 1.8V signal fixing 953 to fix a signal from 3.3V to 1.8V, and suspends a 1.8V clock too. Thus, a 1.8V-system circuit at the time that a substrate bias is drawn to or biased up to −V1 corresponding to a low power consumption mode, is prevented from malfunctioning.

(2) Thereafter, the operation mode controller 913 outputs a substrate bias control start signal 955 to the substrate bias generator 903, based on the timing for the 1.8V signal fixing 953. Between the signal fixing 953 and the substrate bias control start 955, a signal is actually fixed and a time difference up to the suspension of the supply of the signal to the 1.8V region is set. The time difference can be measured by a timer, based on a RTC clock for the RTC circuit 914.

(3) In response to the substrate bias control start signal 955, the substrate bias generator 903 starts to bias a substrate bias for a 1.8V-system substrate up to −V1, e.g., to Vbp2 (+2.8V) corresponding to −V1 in the case of PMOS, and Vbn2 (−1.0V) corresponding to −V1 in the case of NMOS. During a period in which the substrate bias is being biased or settled down up to −V1, the substrate bias generator 903 feeds back a signal 956 being under substrate bias control to the operation mode controller 913.

(4) In a state in which the substrate bias is being biased or settled down up to −V1, the processor main circuit 902 is deactivated. Further, since a leak current is also less reduced, the amount of consumption of the current is small.

(5) When the operation mode controller 913 receives the interrupt signal 958 via the IO circuit 909 through the use of a control signal 957 (external pin) in this condition, the operation mode controller 913 cancels or release the substrate bias control start signal 955.

(6) In response to the release or cancellation of the substrate bias control start signal 955, the substrate bias generator 903 starts to return the substrate bias of the 1.8V-system substrate to a potential indicative of an operating state, e.g., Vbp1 (+1.5V) corresponding to +V2 in the case of PMOS, and Vbn1 (+0.3V) corresponding to +V2 in the case of NMOS. A predetermined time is needed to recover the substrate bias. When the substrate bias is brought back, the signal 956 being under substrate bias control is released or cancelled, so that its release is notified to the operation mode controller 913.

(7) In response to the signal 956 being under substrate bias control, the operation mode controller 913 releases the 1.8V signal fixing 953. Owing to the release or cancellation of the 1.8V signal fixing 953 after the release of the signal being under substrate bias control, the 1.8V-system circuit is prevented from malfunctioning.

(8) A signal is inputted to the 1.8V-system circuit such as the processor main circuit 902 or the like, and hence the processor chip 901 enters the normal mode 982. Thus, the processor main circuit 902 starts its normal operation.

Thus, the processor chip 901 enters the low power consumption mode and can be reset according to an interrupt.

Figures 22, 23:
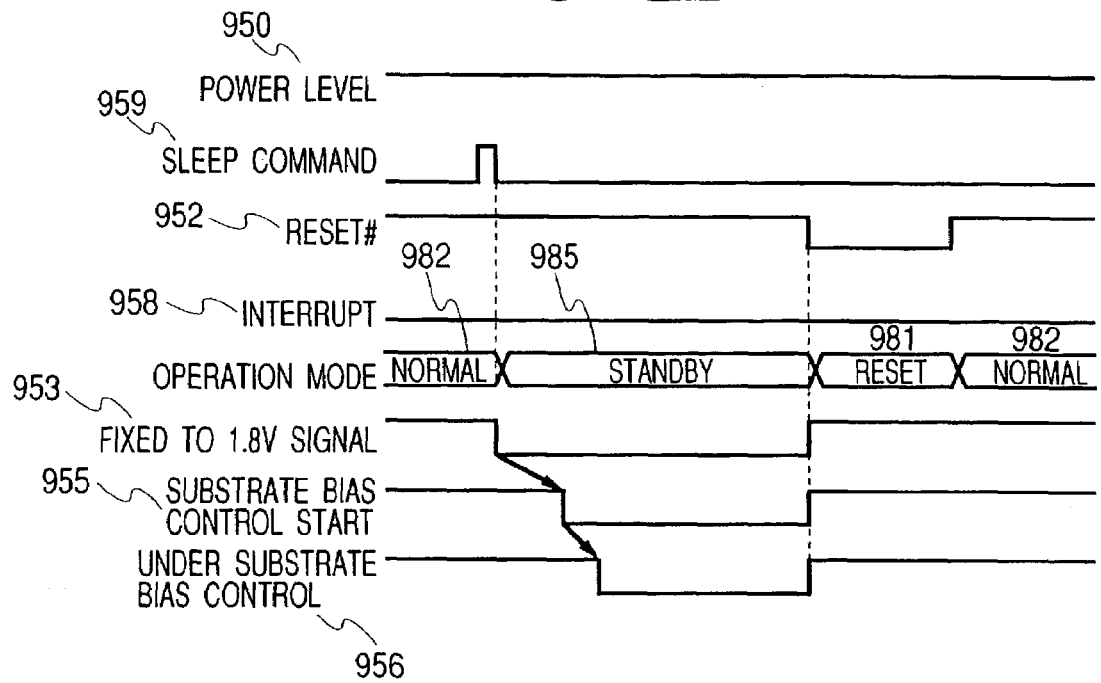
FIG. 22 is a timing diagram for describing a recovery sequence to the normal state of the microcomputer system shown in FIG. 19.
FIG. 23 is an operation mode explanatory diagram of another example of a microcomputer according to the present invention.

A timing diagram for describing a recovery sequence to the normal state of the microcomputer system shown in FIG. 19 is shown in FIG. 22. The same drawing shows an example in which an operation mode enters a standby mode 985 through the use of a normal sleep command 959, and the operation mode is recovered to a normal mode 982 according to RESET#952.

(1) According to a sleep command 959, the operation mode enters the standby mode 985. Here, the operation mode controller 913 outputs 1.8V signal fixing 953 to fix a signal from 3.3V to 1.8V, and suspends a 1.8V clock too. Thus, a 1.8V-system circuit at the time that a substrate bias is drawn to or biased up to −V1, is prevented from malfunctioning. Thereafter, the completion of signal fixing is measured according to 1.8V signal fixing 953. Further, the operation mode controller 913 outputs a substrate bias control start signal 955 to the substrate bias generator 903.

(2) In response to the substrate bias control start signal 955, the substrate bias generator 903 starts to bias a substrate bias for a 1.8V-system substrate up to −V1, e.g., to Vbp2 (+2.8V) corresponding to −V1 in the case of PMOS, and to Vbn2 (−1.0V) corresponding to −V1 in the case of NMOS. During a period in which the substrate bias is being biased or settled down, the substrate bias generator 903 feeds back a signal 956 being under substrate bias control to the operation mode controller 913.

(3) In a state in which the substrate bias is being biased or settled down up to −V1, the processor main circuit 902 is deactivated. Further, since a leak current is also less reduced, the amount of consumption of the current is small.

(4) In this condition, the operation mode controller 913 receives RESET#952 to release the substrate bias control start signal 955.

(5) In response to the release or cancellation of the substrate bias control start signal 955, the substrate bias generator 903 starts to return the substrate bias of the 1.8V-system substrate to a potential +V2 indicative of an operating state, e.g., Vbp1 (+1.5V) corresponding to +V2 in the case of PMOS, and Vbn1 (+0.3V) corresponding to +V2 in the case of NMOS. When the substrate bias is brought back, the substrate bias generator 903 notifies it to the operation mod controller 913 through the use of the signal 956 being under substrate bias control.

(6) In response to this release signal, the operation mode controller 913 releases or cancels the 1.8V signal fixing 953.

(7) After a reset state 981 is completed, a signal is inputted to the 1.8V-system circuit such as the processor main circuit 902 or the like, and hence the processor chip 901 enters the normal mode 982. Thus, the processor main circuit 902 starts its normal operation. As described above, the processor chip 901 enters a low power consumption mode and can hence be recovered by reset.

As described above, the processor chip 901 includes a portion supplied with 1.8V as the source or power supply voltage, and a portion supplied with 3.3V as the source or power supply voltage. As the portion supplied with 1.8V, may be mentioned, e.g., the processor main circuit 902 or the like. This portion is a portion which is large in circuit scale and needs to be activated at high speed. Since the circuit scale increases and the high-speed operation is required, the power consumed or used up by the portion increases. In the present embodiment, the source voltage is lowered to reduce such power consumption.

Since the operating speed is slow when the source voltage is reduced (to 1.8V, for example), the substrate bias voltage is set to +V2, e.g., Vbp1 (+1.5V) corresponding to +V2 in the case of PMOS, or Vbn1 (+0.3V) corresponding to +V2 in the case of NMOS to reduce an effective threshold voltage of each MOSFET (reduce it to Vth<about 0.4V, for example). In addition, the weak forward bias state is held between the source of the MOSFET and the well. Further, in the present embodiment, the substrate voltage is switched to −V1 to reduce a subthreshold leak current in such a non-operating state as a sleep mode to thereby change the source of the MOSFET and the well region to the back bias state.

On the other hand, for instance, the RTC circuit 914 is used as the portion supplied with 3.3V as the source voltage. Since these circuits are small in scale and operated at low speed, power consumption is low. Thus, such circuit blocks need not to reduce the source voltage. For instance, the voltage can be set to Vth>about 0.5V. An advantage is brought about in that since it is not necessary to lower the threshold of a MOSFET, the source of the MOSFET and the well or substrate are fixed to the same potential even in the case of the operating state, and the substrate bias is changed to −V1 as described above to reduce the subthreshold leak current, thereby making it unnecessary to take measures against currents under substrate control.

If the subthreshold leak current of a small-scaled circuit like the RTC circuit 914 presents a problem, then the substrate bias is switched to −V1 when it is brought to a non-operating state, to thereby supply a back bias voltage between the source of the MOSFET and the well and increase the threshold voltage through the use of a substrate effect, whereby a leak current may be reduced in the same manner as described above.

The processor chip 901 according to the present embodiment uses both source or power supply voltages properly. In this case, the portion, which needs a large-scale high speed operation, may be one which makes use of a low-voltage and low-threshold MOS under substrate control and uses a high-voltage and high-threshold MOS while being changed to the negative voltage −V1 as described above, or may be one which uses it as a high threshold voltage on a process basis without the substrate control. Although a method of manufacturing MOS transistors different in threshold value is not limited in particular, it can be implemented by changing the amount of channel implantation. Alternatively, even changing the thickness of a gate oxide film can materialize it. In the latter, the MOS transistor may be configured so that the thickness of the oxide film is made thick to increase the threshold value. Since the high threshold MOS is operated at a high voltage, it is necessary to increase the thickness of the oxide film. Since the input/output circuit 909 needs to transmit and receive an external signal amplitude 3.3V, the same MOS transistor as the high-voltage threshold MOS may preferably be used because processes can be shared.

Another example illustrative of operation modes for a microcomputer is shown in FIG. 23. As the operation modes, may be mentioned, a normally-operated normal operation mode 1082, and a reset mode 1081 in a manner similar to FIG. 14. As modes operated with low power consumption, may be mentioned, sleep mode 1083, deep sleep mode 1084, standby mode 1085, hardware standby mode 1086, a RTC (Real Time Clock) battery backup mode. An IDDQ measurement is used as a test mode.

Since a high-speed operation is required upon the normal operation 1082 in a manner similar to the above, such a voltage +V2 that the source of each MOSFET and a well are brought to a weak forward bias state, is supplied as a substrate bias voltage. Since it is necessary to reset all the functions upon the rest 1081, such a voltage +V2 that they are brought to the weak forward bias state, is supplied as the substrate bias voltage. In the lower power consumption mode, the source and well are brought to 0V in place of such a voltage +V2 that they are brought to the weak forward bias state such as shown in FIG. 14, in the case of the sleep mode 1083 and deep sleep mode 1084 short in recovery time as viewed from the low power consumption mode. Thus, the present example is intended to achieve harmony with the recovery time while low power consumption is being made.

Other are similar to FIG. 14. The RTC battery backup mode is a mode for supplying only power or power supply for a RTC circuit operated at 3.3V. Since the transition to this mode is started from the low power consumption mode, such a voltage −V1 that the source and well are brought to the back bias state, is supplied. Further, since the measurement of IDDQ is a mode for measuring a standby current and measuring a through current developed due to a short-circuit and failure in transistor, it is, in this case, necessary to surely supply such a voltage −V1 thats the source and well are brought to the back bias state to thereby reduce leak power of a chip and make it easy to find the failure. Thus, in the present embodiment, the substrate potential is changed over the three stages +V2, 0 and −V1 in association with the operation modes.

Figure 24:
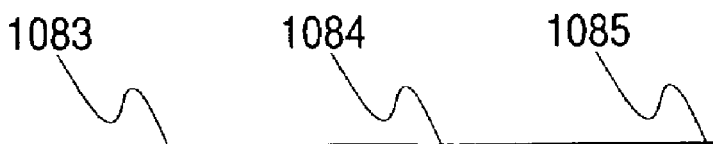
FIG. 24 is a diagram showing the relationship between the respective circuit blocks and operation modes for describing another example illustrative of low power consumption modes of the one-chip microcomputer according to the present invention.

FIG. 24 shows the relationship between respective circuit blocks and operations modes for describing another example illustrative of low power consumption modes of the one-chip microcomputer according to the present invention. As the low power consumption modes for the one-chip microcomputer according to the present invention, may be mentioned, three types of sleep mode 1083, deep sleep mode 1084, and standby mode 1085 in a manner similar to FIG. 16.

In the sleep mode 1083, only clocks for the computing devices such as the CPU 971, FPU 972, cache 973, etc. are held in a halt state, and the substrate bias voltage is set to such 0V that the source and well are made identical in potential. Namely, a substrate potential is set to 0V in the case of an n channel type MOSFET, whereas it is set to the same voltage Vdd as an operating voltage in the case of a p channel type MOSFET. Thus, power consumption is reduced as compared with the embodiment shown in FIG. 16. On the other hand, in the transfer of DMA by the DMAC 975, and normal refreshes (1024 refreshes/16 milliseconds) of DRAM (Dynamic RAM) and SDRAM (Synchronous Dynamic RAM) by the BSC 974, their operations are slightly slow. However, no problems arise because their operations need not to speed up so far. However, it is necessary to switch the substrate bias from 0 to +V2 with respect to the recovery time from the sleep mode 983 to the normal operation mode 982. The response of the computing device such as the CPU 971, FPU 972, cache 973 or the like becomes slow by its switching time.

Since all the operation clocks are suspended and such a voltage −V1 that the source and well are brought into the reverse bias state, is supplied as the substrate bias voltage in the standby mode 985, power consumption is extremely low. The DMA transfer cannot be performed because no clocks are supplied. It is necessary that as to the refresh of the DRAM and SDRAM, control signals (RAS signal and CAS signal) for each individual memories are set by use of the BSC 974 so that the memories enter into such a self refresh mode that they per se perform refresh, prior to entering into the standby mode 985. Since, however, the clocks are in the halt state, the recovery time from the standby mode 1085 to the normal operation 1082 becomes long because of standby or waiting for the stabilization of clock oscillations and the recovery time as viewed or counted from a substrate bias state. The deep sleep mode 1084 is a low power consumption mode placed between the sleep mode 1083 and the standby mode 1085. The substrate bias voltage is set to 0V so as to give priority to low power consumption in a manner similar to the sleep mode 1083, the DMA transfer is prohibited and the self refresh is given. Therefore, the deep sleep mode 1084 provides low power consumption as compared with the sleep mode 1083.

Figure 25:
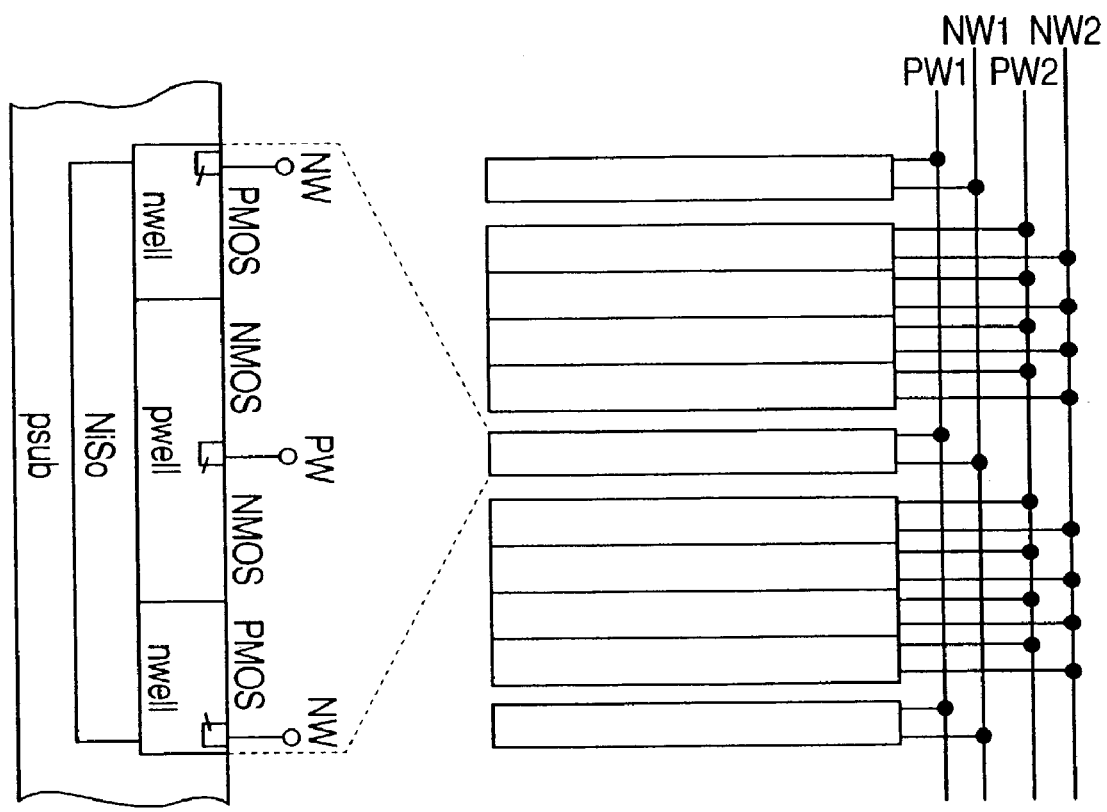
FIG. 25 is a schematic block diagram showing another embodiment of a CMOS logic circuit according to the present invention.

A schematic block diagram showing another embodiment of a CMOS logic circuit according to the present invention is shown in FIG. 25. In the present embodiment, a CMOS circuit having specific function blocks is divided into a plurality of blocks. As one of the respective blocks is illustratively shown as a typical one, a P type well pwell for forming an n channel type MOSFET, and N type wells nwell for respectively forming p channel type MOSFETs are provided over NiSo formed in a substrate psub. Two types of combined ones of PW1, NW1 and PW2, NW2 are prepared as terminals for substrate bias voltages supplied to the wells. They are divided and provided according to performance required of the blocks.

Voltages like 0V and VDD at which the source of the MOSFET and the well are brought to the same potential state, are respectively applied to the substrate bias voltage terminals PW2 and NW2 upon operation. Upon standby, voltages like −Vbb and VDD+Vbb at which the source of the MOSFET and the well are brought to a back bias state, are respectively applied thereto. Therefore, the blocks each provided with the substrate bias voltage terminals PW2 and NW2 are configured so that upon the operation, each MOSFET is set to an intrinsic relatively high threshold voltage as described above, priority is given to low power consumption, and an operating speed is relatively set slow. Accordingly, theses blocks are configured so as to form a logic gate circuit for performing signal processing at a relatively low speed, which does not constitute a critical path of the specific function blocks.

Voltages like 0V and VDD at which the source of the MOSFET and the well are brought to the same potential state, are respectively applied to the substrate bias voltage terminals PW2 and NW2 upon operation. Upon standby, voltages like −Vbb and VDD+Vbb at which the source of the MOSFET and the well are brought to a back bias state, are respectively applied thereto. Therefore, the blocks each provided with the substrate bias voltage terminals PW2 and NW2 are configured so that upon the operation, each MOSFET is set to a true relatively high threshold voltage as described above, priority is given to low power consumption, and an operating speed is relatively set slow. Accordingly, these blocks are configured so as to form a logic gate circuit for performing signal processing at a relatively low speed, which does not constitute a critical path of the specific function blocks.

Since the voltages for bringing the source of each MOSFET and the well to the back bias state are applied to any block upon the standby, a leak current (tailing current or subthreshold leak current) that flows each MOSFET held in an off state can greatly be reduced when the specific function blocks perform no signal processing, thereby making it possible to implement low power consumption.

Figure 26:
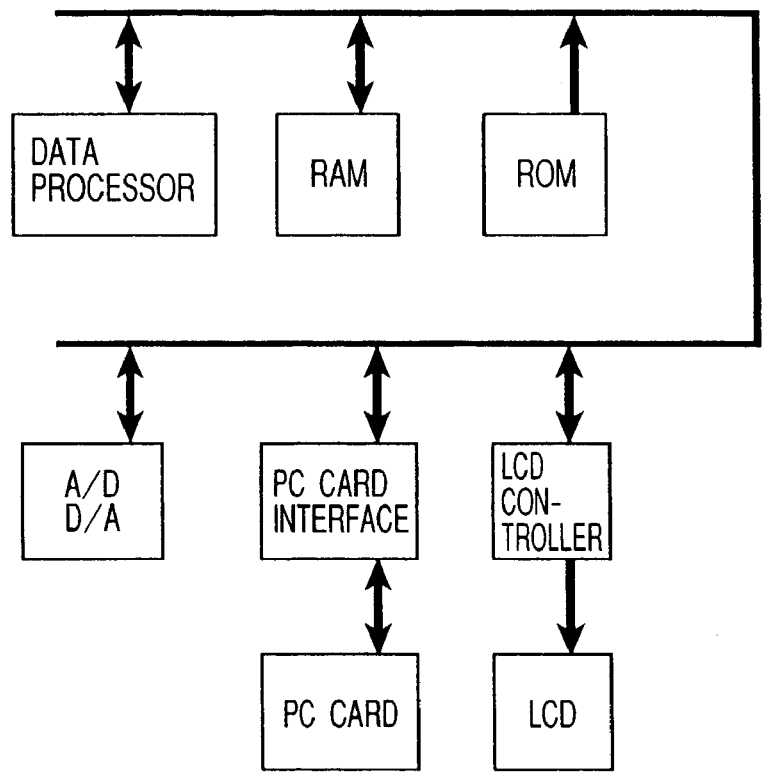
FIG. 26 is a block diagram illustrating one embodiment of a microcomputer system to which the present invention is applied.

A block diagram illustrating one embodiment of a microcomputer system to which the present invention is applied, is shown in FIG. 26. Although not restricted in particular, the microcomputer system according to the present embodiment is configured as a battery-driven portable electronic apparatus.

In the microcomputer system, peripheral devices such as a RAM (Random Access Memory), a ROM (Read Only Memory), an analog/digital converter A/D, a digital/analog converter D/A, a PC card interface, an LCD controller, etc. are connected to one another through a system bus with a data processor (central processing unit) as the center.

With a PC card inserted into a slot, the PC card interface is electrically connected thereto and is capable of writing and reading data. The PC card is used as a detachable external storage device or memory. The LCD controller drives a liquid crystal display LCD in response to display data delivered from the data processor to thereby cause the liquid crystal display LCD to perform a display operation.

Although not restricted in particular, the data processor has a configuration similar to a so-called microprocessor. Namely, although the details of the data processor are not illustrated, the data processor includes input/output circuits such as a bus driver connected to a microinstruction ROM for decoding instructions written into an instruction register to thereby form various microinstructions or control signals, an arithmetic or computing circuit, and a general-purpose register (RG6 or the like), a bus receiver, etc. thereinside.

The data processor reads an instruction stored in the read only memory ROM and performs an operation corresponding to the instruction. The data processor performs the capturing of external data inputted through the input/output circuits, the input/output of data to and from a control circuit, the reading of an instruction from the read only memory ROM, and data like fixed data necessary for the execution of the instruction, the supply of data to be D/A converted to the D/A converter, the reading of data A/D-converted by the A/D converter, the reading of data into the RAM comprised of a static type memory or the like, write operation control, etc.

The data processor receives a system clock signal generated from a clock generator and is operated according to an operating timing and a cycle determined based on the system clock signal. The data processor has a main portion provided thereinside, which comprises a CMOS circuit, i.e., a circuit comprised of pMOS and nMOS. Although not restricted in particular, it includes a static operable CMOS static circuit like a CMOS static flip-flop, and a CMOS dynamic circuit which performs the precharge of an electrical charge to a signal output node and the output of a signal to the signal output node in synchronism with the system clock signal.

When the supply of the system clock signal is suspended, the data processor is brought to an operation halt state. In the halt state, a signal outputted from the dynamic circuit undesirably changes due to an undesired leak current produced in the circuit. A circuit like the resister circuit having the static flip-flop circuit configuration holds previous data therein even during a non-supply period of the system clock signal. During the system clock signal non-supply period, the transition of signal levels at various nodes in the static circuit lying inside the data processor is suspended, and the charge discharge and precharge at each output node in the dynamic circuit are suspended.

When a relatively large back bias voltage is supplied to the source of each MOSFET and the well with this condition as the standby state, only a small current regarded as substantially zero flows as compared with relatively large consumed-current like an operating current used up or consumed by the CMOS circuit kept in the operating state, i.e., charge and discharge currents supplied from a power or source line so that signal displacements are supplied to the various nodes and stray capacitance and parasitic capacitance of wirings connected to their corresponding nodes. Namely, only the small current equal to the leak current restricted as described above in the CMOS circuit flows in the data processor. Thus, the data processor is brought to a low power consumption state, and hence the life of the battery for the batter-driven portable electronic apparatus can be made long.

By executing similar control in association with the standby state of the data processor, other peripheral devices can be reduced in power consumption. As a result, the current consumption of the whole system at the time that the portable electronic device is placed in the standby state, can greatly be reduced.

Figure 27:
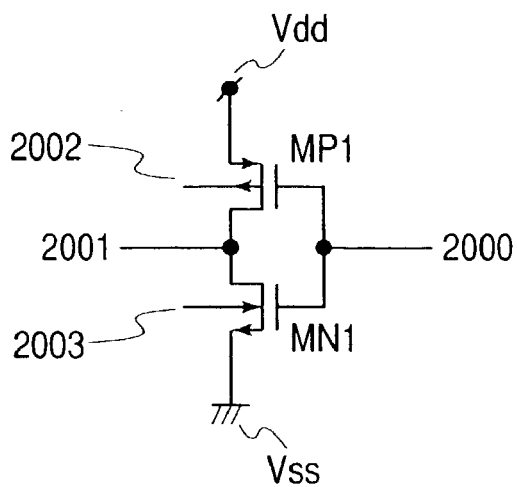
FIG. 27 is a circuit diagram showing one embodiment of a CMOS circuit to which the present invention is applied.

A circuit diagram of one embodiment of a CMOS circuit to which the present invention is applied, is shown in FIG. 27. The same drawing shows an inverter circuit corresponding to one basic circuit for the CMOS circuit. A source of a p channel type MOSFETMP1 is supplied with an operating voltage Vdd. A source of an n channel type MOSFETMN1 is supplied with a circuit's ground potential Vss. The gates and drains of the MOSFETMP1 and MN1 are respectively connected in common and serve as an input terminal 2000 and an output terminal 2001 respectively. In the present embodiment, a back gate (n type well region) 2002 of the p channel type MOSFETMP1, and a back gate (p type well region) 2003 of the n channel type MOSFETMN1 are respectively supplied with the above-described back bias voltages Vbp and Vbn according to operation modes.

The threshold voltages of the MOSFETMP1 and MN1 can be changed to three types of small, middle and large ones in association with the bias voltages supplied to the back gates 2002 and 2003. It is possible to cause the CMOS circuit to perform three types of operating states of a high-speed operation (leak current: large), a middle-speed operation (leak current: small) and a low-speed operation (leak current: extremely small) in association with them.

Figure 28:
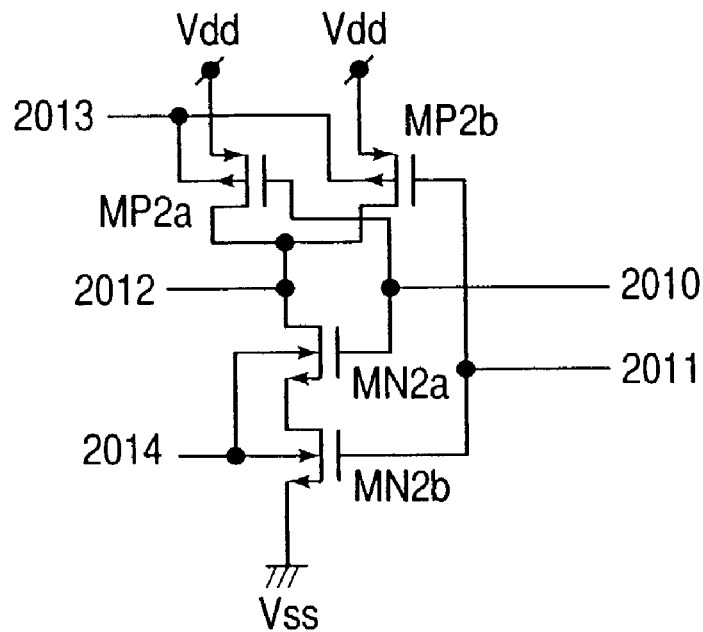
FIG. 28 is a circuit diagram illustrating another embodiment of a CMOS circuit to which the present invention is applied.

A circuit diagram illustrating another embodiment of a CMOS circuit to which the present invention is applied, is shown in FIG. 28. The same drawing shows a basic two-input logic gate circuit for the CMOS circuit. The logic gate circuit constitutes a NAND gate circuit where such positive logic that a high level corresponding to an operating voltage Vdd is defined as logical 1, and a low level like a circuit's ground potential Vss is defined as logical 0, is adopted. Reversely when such negative logic that the high level corresponding to the operating voltage Vdd is defined as logical 0 and the low level like the circuit's ground potential Vss is defined as logical 1, is adopted, the logic gate circuit constitutes a NOR gate circuit.

Sources of two p channel type MOSFETMP2$a$ and MP2$b$ are respectively supplied with the operating voltage Vdd. A source of one n channel type MOSFETMN2$b$ of two n channel type MOSFETs is supplied with the circuit's ground potential Vss. Drains of the MOSFETMP2$a$ and MP2$b$, and a drain of the other n channel type MOSFETMN2$a$ are commonly connected to an output terminal 2012. A source of the MOSFETMN2$a$ and a drain of the MOSFETMN2$b$ are connected to each other. Thus, the p channel type MOSFETMP2$a$ and MP2$b$ are connected in parallel, and the n channel type MOSFETMN2$a$ and MN2$b$ are connected in series.

Further, gates of the p channel type MOSFETMP2$a$ and MP2$b$ and n channel type MOSFETMN2$a$ and MN2$b$ provided two by two are commonly connected to their corresponding input terminals 2010 and 2011. Back gates (n type well regions) 2013 of the p channel type MOSFETMP2$a$ and MP2$b$, and back gates (p type well regions) 2014 of the n channel type MOSFETMN2$a$ and MN2$b$ are respectively supplied with the back bias voltages Vbp and Vbn according to operation modes.

The threshold voltages of the MOSFETMP2$a$, 2$b$ and MN2$a$, 2$b$ can be changed to three types of small, middle and large ones in association with the bias voltages supplied to the back gates 2013 and 2014. It is possible to cause the CMOS circuit to perform three types of operating states of a high-speed operation (leak current: large), a middle-speed operation (leak current: small) and a low-speed operation (leak current: extremely small) in association with them.

Figure 29:
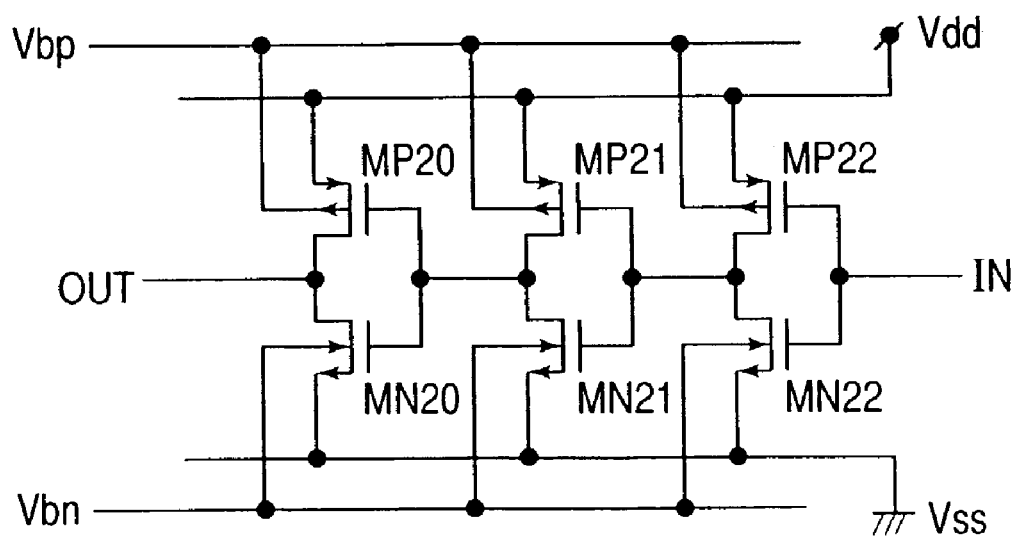
FIG. 29 is a circuit diagram showing a further embodiment of a CMOS circuit to which the present invention is applied.

A circuit diagram showing a further embodiment of a CMOS circuit to which the present invention is applied, is shown in FIG. 29. Although not restricted in particular, the same drawing is intended for a delay circuit using an inverter circuit based on a CMOS circuit. The present embodiment is intended to connect the inverter circuit shown in FIG. 27 in tandem and obtain an output signal OUT delayed with respect to an input signal IN. When, in this case, the number of the inverter circuits is an odd number as shown in the same drawing, an inverted delay signal is obtained, whereas when the number of the inverter circuits is an even number, an in-phase delay signal is obtained.

The threshold voltages of the MOSFETMP20 to MP22 and MOSFETMN20 to MN22 can be changed to three types of small, middle and large ones in association with the bias voltages Vbp and Vbn supplied to the back gates in a manner similar to the above. It is possible to cause the CMOS circuit to perform three types of operating states of a high-speed operation (leak current: large), a middle-speed operation (leak current: small) and a low-speed operation (leak current: extremely small) in association with them. On the other hand, the delay time can also be used by being changed over to three stages of short, intermediate and long in association with them. Namely, since the source of the MOSFET and the well are simply brought to the back bias state, the present embodiment can be utilized even for the control of circuit operations as in the case where the delay time is made long, as well as for a reduction in leak current at standby.

Figure 30:
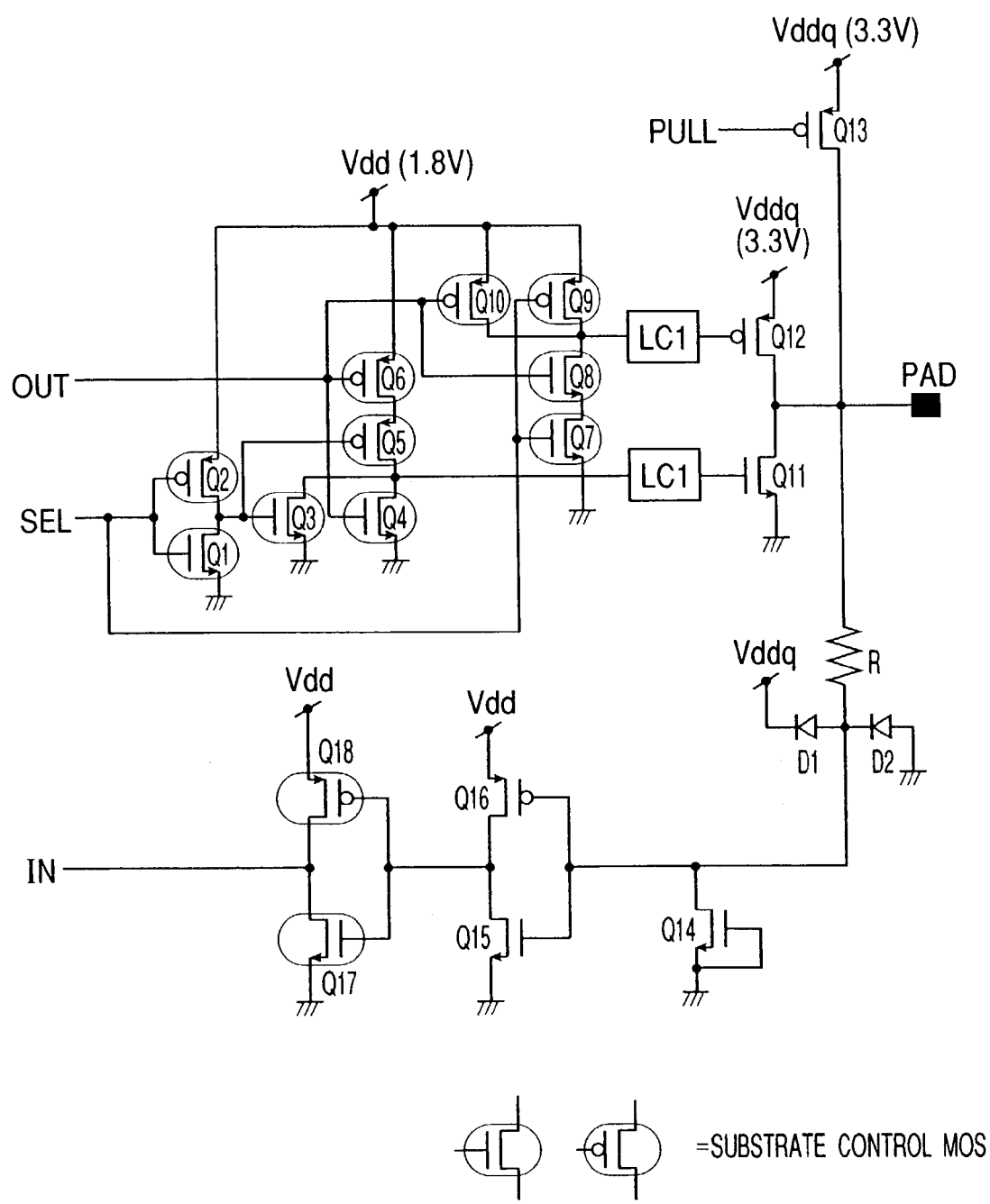
FIG. 30 is a circuit diagram illustrating one embodiment of an input/output circuit of a semiconductor integrated circuit device according to the present invention.

A circuit diagram illustrating one embodiment of an input/output circuit of a semiconductor integrated circuit device according to the present invention is shown in FIG. 30. The output circuit employed in the present embodiment comprises a signal processing portion operated at an internal voltage Vdd like 1.8V, and an output portion operated at a power supply or source voltage Vddq like 3.3V supplied from an external terminal. Level converters LC1 and LC2 are provided between the signal processing portion and the output portion. As will be described later, the level converters LC1 and LC2 respectively comprise combinations of circuits operated at the two types of voltages Vdd and Vddq. On the other hand, the input circuit also comprises an input portion operated at the source voltage Vddq, and a low-voltage portion operated at the internal voltage Vdd. The internal voltage Vdd is formed by stepping down the source voltage Vddq supplied from the external terminal with an unillustrated step-down circuit.

Each of MOSFETs, which constitute the signal processing portion and low-voltage portion operated at the internal voltage Vdd, comprises a substrate control MOS for controlling a substrate (well) potential according to the operation mode as described above. Thus, the source of each MOSFET and the well are brought to a weak forward bias state upon operation, whereas upon non-operation (standby), the source of the MOSFET and the well are brought to a reverse bias state. Consequently, the present embodiment is operated at high speed upon its operation, and brought to low power consumption upon its non-operation.

On the other hand, since input voltages per se inputted to gates of a p channel type output MOSFETQ12 whose drain is connected to a pad PAD connected to an external terminal, and an n channel type output MOSFETQ11 whose drain is connected to the pad PAD, are of high amplitudes (Vddq to 0V) formed by the level converters LC1 and LC2, it is not necessary to form threshold voltages thereof in small form as in the case of each MOSFET for an internal circuit operated at the internal voltage Vdd. Therefore, the source of each MOSFET and the well are fixedly set to the same potential. Namely, the well or semiconductor substrate in which the p channel type MOSFETQ12 is formed, is steadily supplied with the external source voltage Vddq, whereas the well or semiconductor substrate in which the n channel type MOSFETQ11 is formed, is supplied with the circuit's ground potential.

Thus, the MOSFETQ11 and Q12 are set to relatively high threshold voltages corresponding to the intrinsic threshold voltages. Since the well or substrate is set to the source voltage Vddq and Vss, a potential delivered to the drains through the pad from the external terminal allows restraint on the occurrence of CMOS latchup. Namely, a voltage margin leading up to the latchup can be increased as compared with the case where such above bias voltages that the weak forward bias state is set between the well and source for the purpose of low threshold voltages, is supplied.

A resistor R, diodes D1 and D2 and a diode-connected MOSFETQ14 constitute an electrostatic protection circuit, which discharges an electrical charge delivered to the pad PAD through the external terminal to thereby prevent gate dielectric breakdown or the like of each MOSFET due to a high voltage.

The signal processing portion of the output circuit performs the operation of complementarily driving the output MOSFETQ12 and Q11 in association with a signal OUT to be outputted when a control signal SEL is rendered effective, and forming or producing an output signal of a high level/low level, and control for bringing both the output MOSFETQ12 and Q11 to an off state regardless of a signal OUT to be outputted when the control signal SEL is rendered ineffective. Thus, the output circuit has a three-state output function comprised of a high level output, a low level output and high impedance. In response to an input signal supplied from an external terminal, the input circuit forms an input signal IN having a low-amplitude signal level corresponding to the internal circuit and supplies it to an unillustrated internal circuit.

Figure 31:
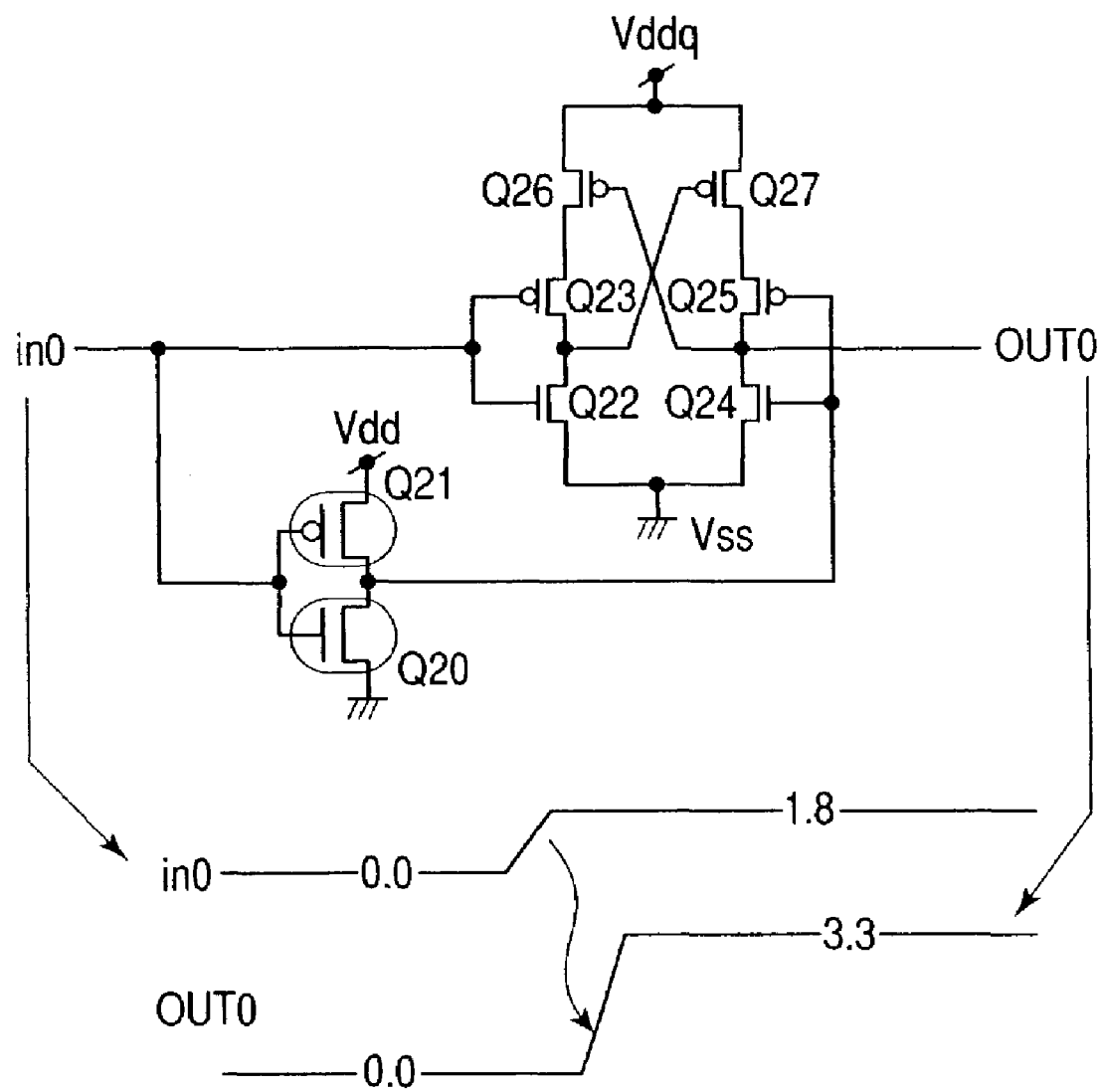
FIG. 31 is a circuit diagram depicting one embodiment of a level converting circuit or converter shown in FIG. 30.

A circuit diagram of one embodiment of the level converting circuit or converter is shown in FIG. 31. MOSFETQ20 and Q21 constitute a CMOS inverter circuit and form an inverted signal of an input signal in0. A level conversion portion comprises a first circuit wherein p channel type MOSFETQ26 and Q23 and an n channel type MOSFETQ22 are series-connected between a source or power supply voltage Vddq and a circuit's ground potential Vss, and a second circuit wherein p channel MOSFETQ27 and Q25 and an n channel type MOSFETQ24 are similarly series-connected therebetween. The MOSFETQ23 and Q22 constitute a CMOS inverter circuit and have gates to which the input signal in 0 having low amplitude (Vdd amplitude) is supplied. The gates of the MOSFETQ24 and Q25 constituting a CMOS inverter circuit in a manner similar to the above are supplied with the low-amplitude input signal inverted by the inverter circuit.

Signals outputted from the CMOS inverter circuits of the first and second circuits are mutually supplied to the gates of the p channel type MOSFETQ27 and Q26 provided on the other source voltage Vddq side to thereby obtain a latch form. Thus, when the input signal in0 is low in level as shown in the drawing, the MOSFETQ24 is brought to an on state in response to a high level of its inverted signal to thereby bring an output signal OUT0 to a low level like the ground potential. Thus, the p channel type MOSFETQ26 is brought to an on state to thereby carry or deliver an output signal having a high level corresponding to the source voltage Vddq to the gate of the p channel type MOSFETQ27 through the p channel type MOSFETQ23 turned on by the low level of the input signal in0, whereby the p channel type MOSFETQ27 is turned off. Accordingly, no leak current is produced through the MOSFETQ27, Q25 and Q24 and hence the output signal OUT0 having such a low level as described above can be formed or produced.

When the input signal in0 is of a high level corresponding to Vdd (1.8V), and its inverted signal is of a low level, the p channel type MOSFETQ27 is turned on by an output signal having a low level formed by the turning on of the MOSFETQ22, so that an output signal OUT0 having a high level corresponding to the source voltage Vddq (3.3V) is formed through the p channel type MOSFETQ25 turned on by the low level of the inverted signal. At this time, the p channel type MOSFETQ26 is brought to an off state by the high level corresponding to the source voltage Vddq of the output signal OUT0. Thus, no leak current is produced through the MOSFETQ22, Q23 and Q26.

In the level converter according to the present embodiment, the p channel type MOSFETQ21 and n channel type MOSFETQ22, which constitute the CMOS inverter circuit for receiving the low-amplitude input signal in0 therein to thereby form its inverted signal, are configured as substrate control MOSs, whereas other MOSFETs are supplied with a fixed potential at which a p well is set to the same potential as each source. Namely, the circuit's ground potential Vss is fixedly supplied to the p well with the n channel type MOSFETs formed therein, whereas the source voltage Vddq is fixedly applied to an n well with the p channel type MOSFETs formed therein.

In the output circuit, input circuit and level converter as described above, MOSFETs whose each gate is supplied with a large-amplitude voltage like an external source voltage Vddq, need to be set to a high withstand voltage as compared with the internal circuit operated at the stepped down voltage Vdd. Therefore, a gate insulating film is formed thick as compared with the internal circuit operated at the low voltage.

Figure 32A:
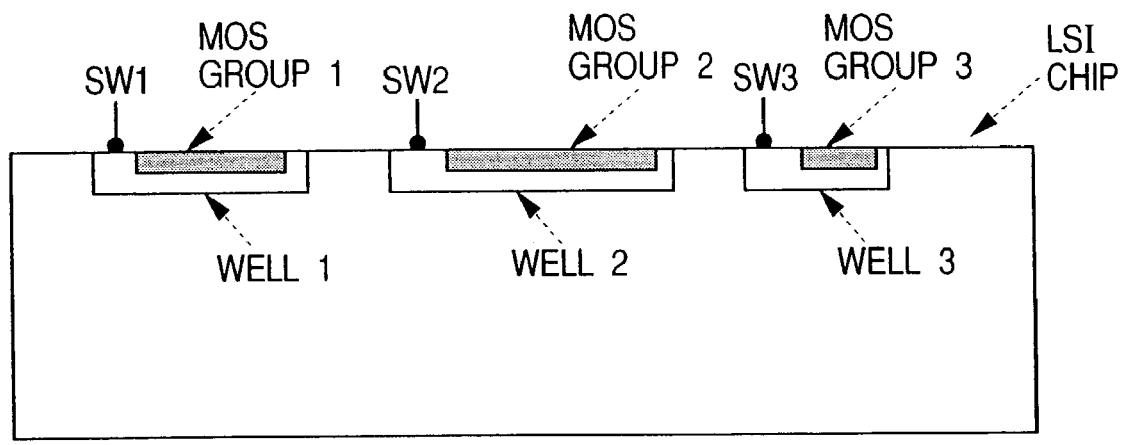
FIG. 32 is a schematic configurational diagram showing another embodiment of a semiconductor integrated circuit device according to the present invention.
Figure 32B:
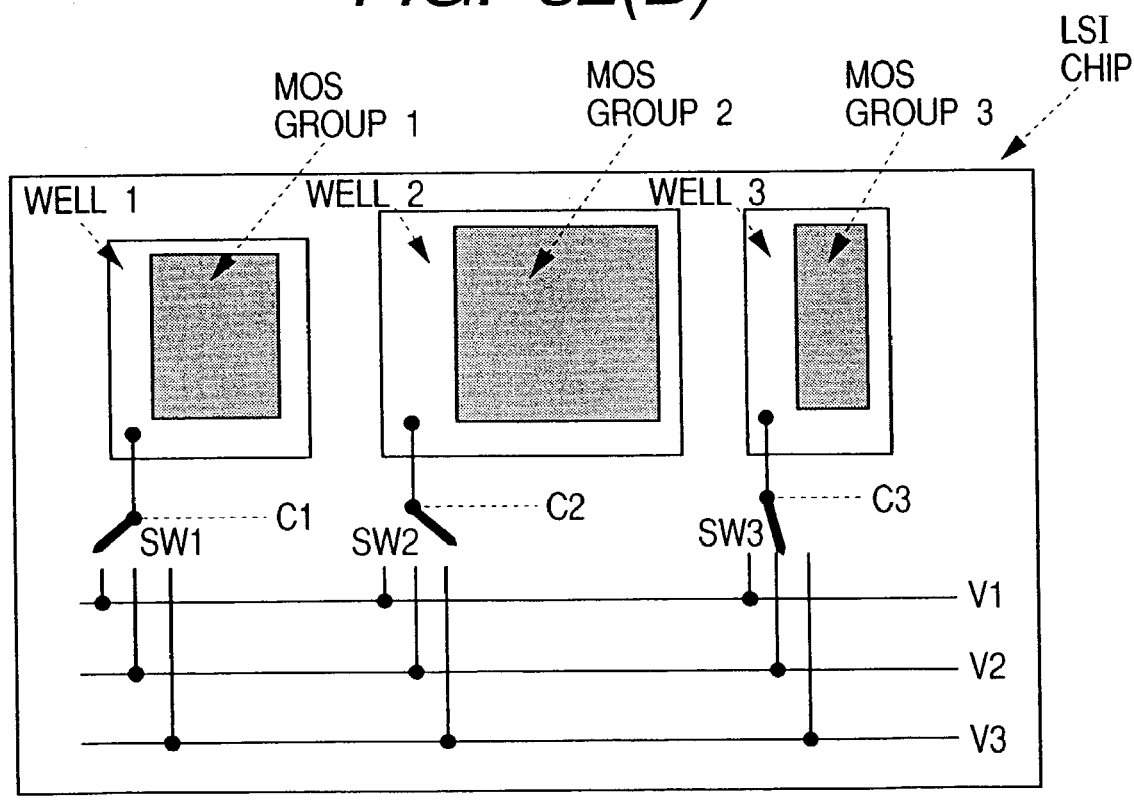

A schematic configurational diagram showing another embodiment of a semiconductor integrated circuit device according to the present invention is shown in FIG. 32. FIG. 32(A) shows a conceptual device structure section, and FIG. 32(B) shows a circuit block corresponding to it.

In FIG. 32(A), three wells 1 through 3 formed so as to be electrically isolated from one another are formed on a semiconductor integrated substrate. A MOS group 1 through a MOS group 3 are formed in the wells respectively. In the case of the CMOS circuit as described above, different conduction type well regions are formed in association with the n channel type MOSFETs and p channel type MOSFETs and electrically isolated from one another. Thus, the wells 1 through 3 are respectively comprised of n and p wells. The triple well structure or SOI structure is used for the wells 1 through 3.

In FIG. 32(B), three types of bias voltages V1 through V3 are selectively supplied to the wells 1 through 3 respectively held in three states, through switches SW1 through SW3. Namely, the switches SW1 through SW3 are switch-controlled by switch control signals C1 through C3 to thereby make it possible to select and supply either one of bias voltages V1 through V3. The switch control signals C1 through C3 are ones produced by taking out part of an instruction set of a processor, for example. When each of the MOSF group 1 through MOS group 3 is of the CMOS circuit, each of the wells 1 through 3 is comprised of n and p wells. On the other hand, each of the bias voltages V1 through V3 also comprises a pair of bias voltages Vbp and Vbn for the n and p wells.

The present embodiment contains the concept of supplying at least two types or more of different substrate bias voltages to the two or more wells separately provided as described above. For instance, the MOS group 1 through MOS group 3 formed in the wells 1 through 3 may be either a logic gate, a static type memory, a flash memory or a dynamic type memory.

The three types of bias voltages V1 through V3 comprise one for bringing the source of each MOSFET and a well suitable for a low power consumption mode to a back bias state, one for brining the source of each MOSFET and a well corresponding to a middle or intermediate speed and an intermediate current at which each MOSFET is activated at about true threshold voltage, to the same potential, and one set as a low threshold voltage, for bringing the source of each MOSFET and the well suitable for a high-speed operation to a weak forward bias state.

In the above-described configuration, the MOS group 1 through MOS group 3 are respectively not limited to the selective supply of the above-described three types of bias voltages V1 through V3 in association with the above-described three types of operation modes. The two types of bias voltages of the three types of bias voltages V1 through V3 are utilized in combination in association with the circuit scale or circuit performance of each MOS group and may be changed over on a limited basis.

Figure 33:
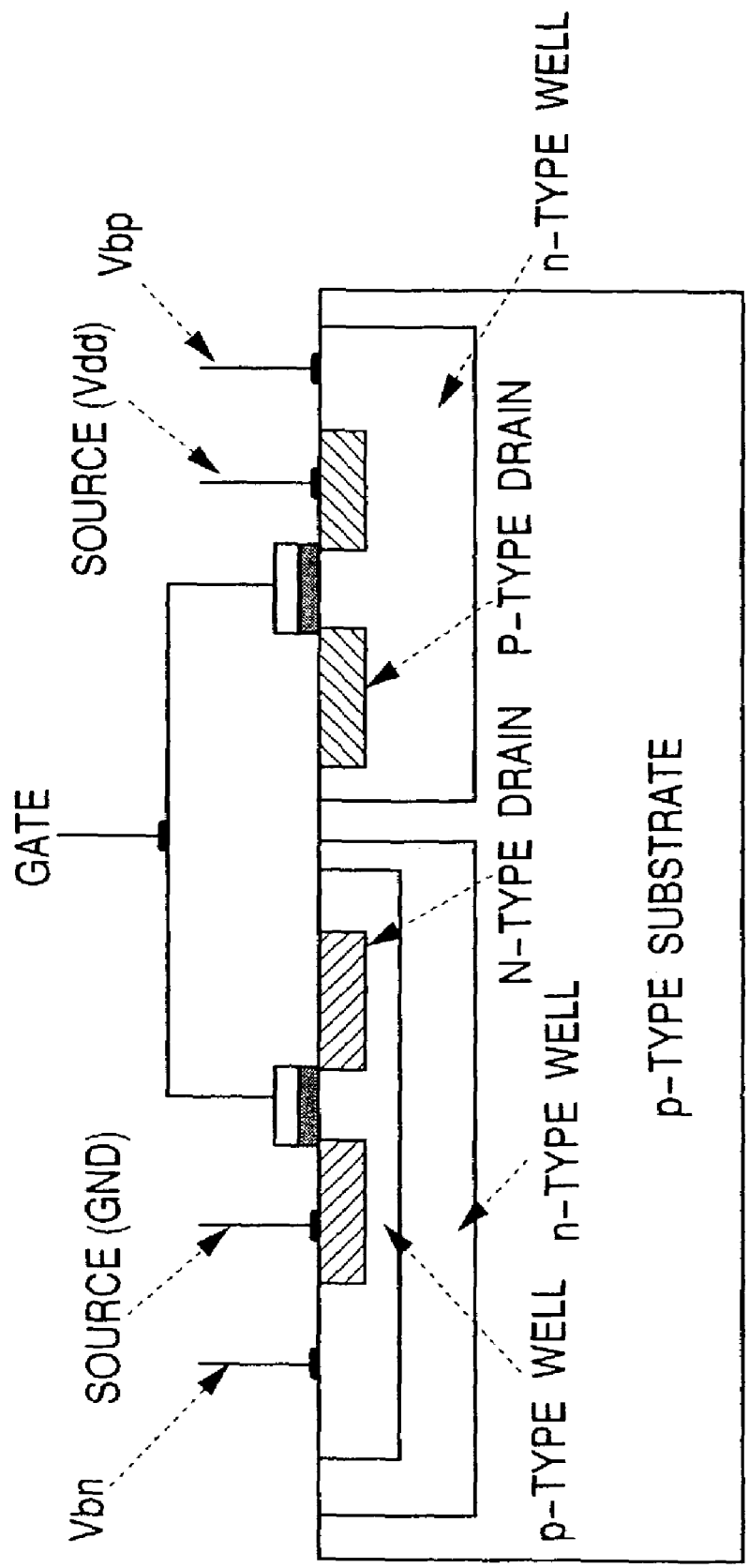
FIG. 33 is a schematic cross-sectional view of a device structure showing a still further embodiment of a CMOS circuit to which the present invention is applied.

A schematic cross-sectional view of a device structure showing a still further embodiment of a CMOS circuit to which the present invention is applied, is shown in FIG. 33. The present embodiment is basically configured as a triple well structure in a manner similar to the embodiment shown in FIG. 6. The present embodiment is different from the embodiment shown in FIG. 6 in that n-type wells for n channel type and p channel type MOSFETs are respectively formed in a p-type substrate, and the p channel type MOSFET has a P-type drain and source formed in one of the two n-type wells. The n channel type MOSFET is provided in such a manner that a p-type well is formed in the other n-type well and an N-type source and drain are formed therein.

The source of the n channel type MOSFET is supplied with a circuit's ground potential GND, and the source of the p channel type MOSFET is supplied with a source voltage Vdd. Further, the p-type well with the n channel type MOSFET formed therein is supplied with a substrate bias voltage Vbn, and the n-type well with the p channel type MOSFET formed therein is supplied with a substrate bias voltage Vbn. These substrate bias voltages Vbp and Vbn are switched over so that their sources and wells are respectively brought to any of a weak forward bias state, the same potential and a back bias state.

Figure 34:
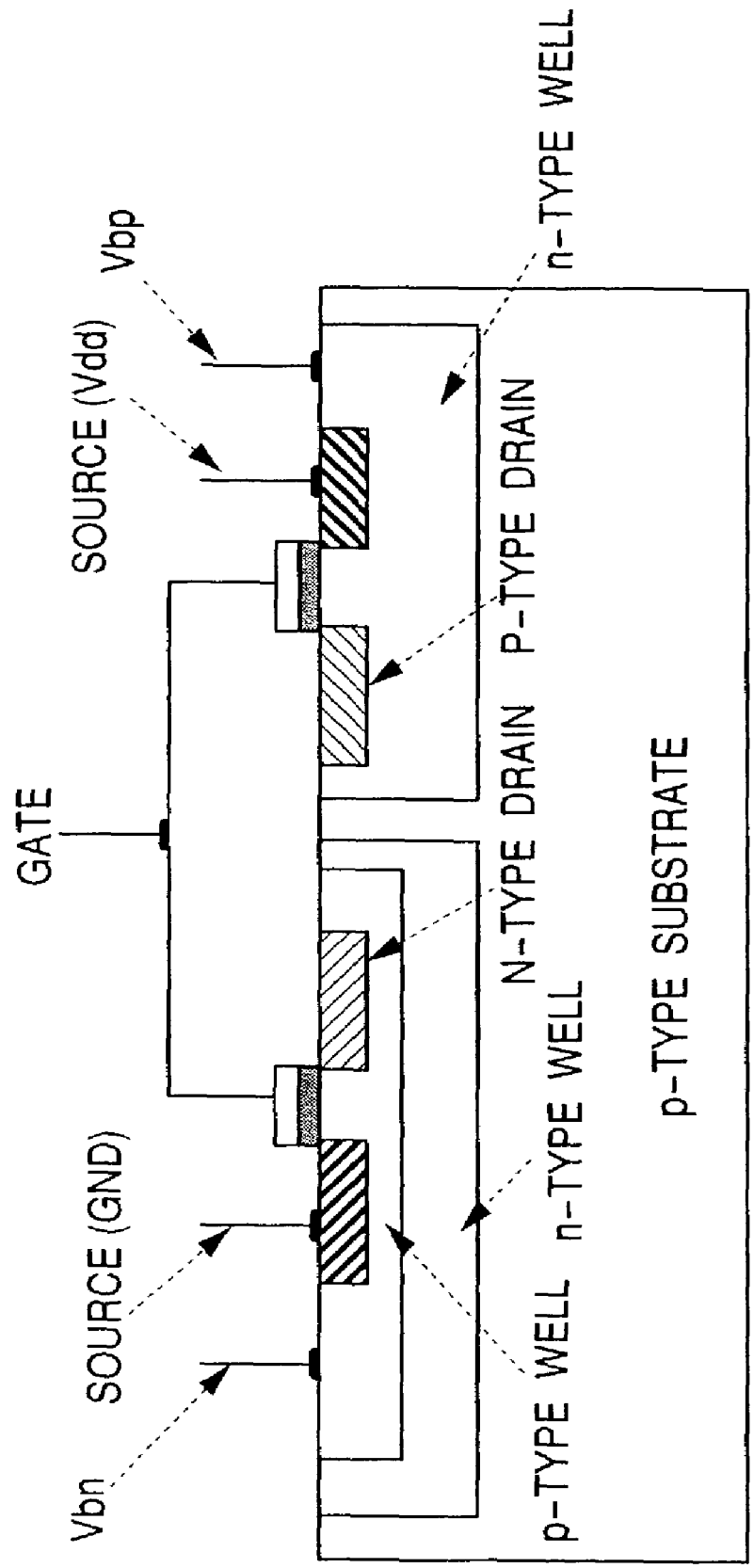
FIG. 34 is a schematic cross-sectional view of a device structure showing a still further embodiment of a CMOS circuit to which the present invention is applied.

A schematic cross-sectional view of a device structure showing a still further embodiment of a CMOS circuit to which the present invention is applied, is shown in FIG. 34. The present embodiment is basically configured as a triple well structure in a manner similar to the embodiment shown in FIG. 33. The present embodiment is different from the embodiment shown in FIG. 33 in that the source and drain of each MOSFET are formed so as to intentionally differ from each other in impurity concentration. Namely, the impurity concentration of the source is set higher than that of the drain. Owing to the increase in impurity concentration on the source side in this way, the injection (leak current) of carriers from the bottom of a source region can further be restrained when the weak forward bias voltage is applied between the source and the well to reduce the threshold voltage of each MOSFET.

Figure 35:
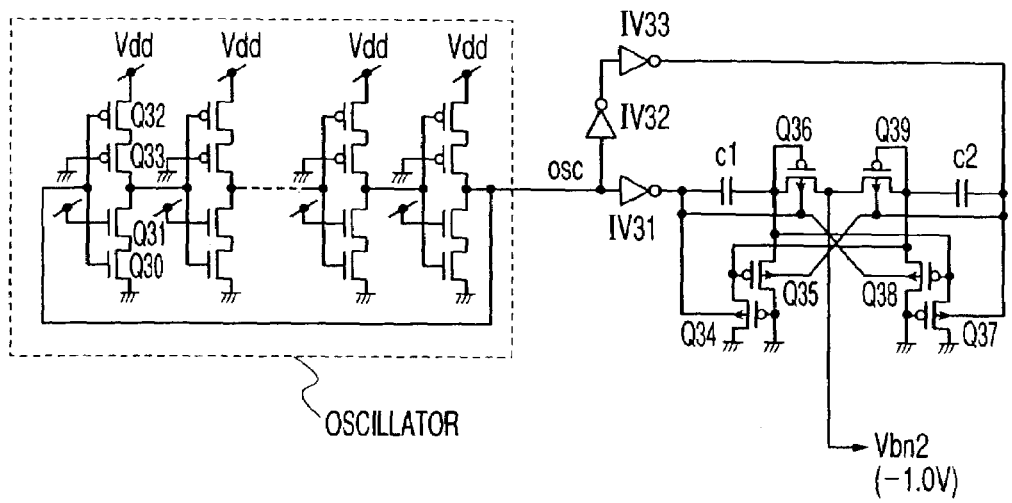
FIG. 35 is a specific circuit illustrating one embodiment of a charge pump circuit which forms a negative voltage.

A specific circuit illustrating one embodiment of a charge pump circuit which forms a negative voltage, is shown in FIG. 35. The circuit shown in FIG. 35 is illustrated by way of example. Since it is considered that the operation thereof can sufficiently be understood according to its circuit diagram, the operation thereof will be explained in brief. An oscillator circuit is configured as follows. A p channel type MOSFETQ33 whose gate is supplied with a circuit's ground potential, and an n channel type MOSFETQ31 are inserted between a p channel type MOSFETQ32 and an n channel type MOSFETQ30 constituting a CMOS inverter circuit to provide a delay function. An odd number of such CMOS inverter circuits are connected in ring form to form an oscillation pulse osc.

The CMOS inverter circuits IV31, IV32 and IV33 constitute a waveform-shaping and drive circuit and forms a pulse signal supplied to the charge pump circuit. The charge pump circuit will be described with attention focused on a capacitor 1c. When a signal outputted from the inverter circuit IV31 is high in level, a p channel type MOSFETQ35 is turned on to perform charge-up. When the inverter circuit INV31 is low in level, a negative voltage is produced from the capacitor c1 to turn on a p channel type switch MOSFETQ36, whereby the operation of biasing or drawing a negative voltage Vbn2 so as to reach a negative potential is carried out. The other capacitor c2 is driven by a pulse opposite in phase to the above, so that the precharge and the negative-voltage output are complementarily performed in accordance with the oscillation pulse osc, whereby a negative-voltage is generated efficiently.

Switch control on the precharge MOSFET and output MOSFET and output MOSFET, and a substrate potential for the switch MOSFET are also switched according to the oscillation pulse osc to thereby reduce a voltage loss due to the complementary switch control and substrate effect. Such a negative-voltage charge pump circuit is used where the substrate bias switching device 104 is built in the semiconductor integrated circuit device as in the embodiment of 13.

When, for instance, the negative voltage Vbn2 is determined by a suitable voltage monitoring circuit and its determined voltage value is reduced to less than or equal to −1V referred to above, the ring oscillator circuit is deactivated. When the substrate potential Vbn2 becomes higher than the desired voltage due to a leak current or the like, the ring oscillator circuit is activated again. The negative voltage Vbn2 may be controlled to a voltage like −1V referred to above under intermittent operation control of such a negative-voltage charge pump circuit. As to the operation control of the ring oscillator circuit in this case, the MOSFETQ33 and Q31 provided to control a current in each CMOS inverter circuit constituting the ring oscillator circuit may be switch-controlled according to the output of the voltage monitoring circuit.

Figure 36:
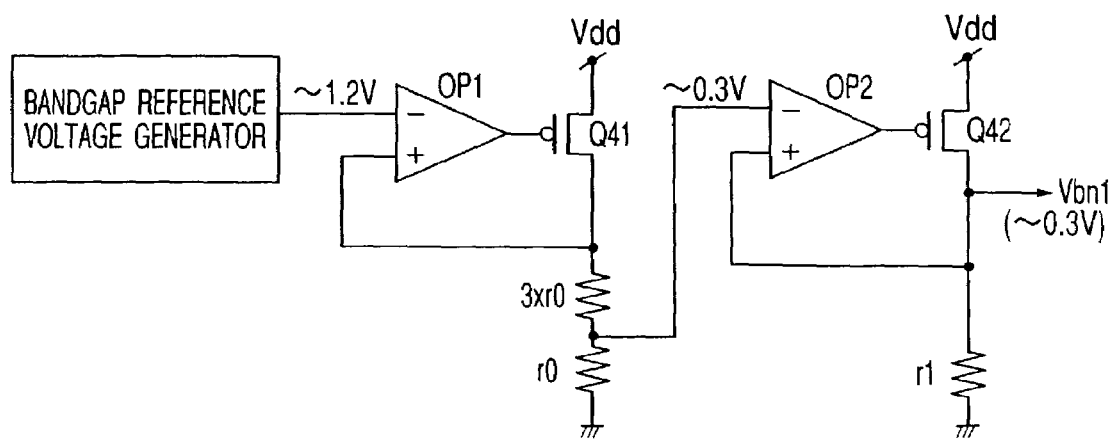
FIG. 36 is a circuit diagram showing one embodiment of a small voltage generating circuit for weak-forward biasing a source of an n channel type MOSFET and a well.

A circuit diagram showing one embodiment of a small voltage generating circuit or generator for weak-forward biasing the source of the n channel type MOSFET and the well is shown in FIG. 36. Although not restricted in particular, the known bandgap reference voltage generator is used to form a constant voltage like 1.2V in the present embodiment. The constant voltage is supplied to an inversion input (−) of an operational amplifier circuit OP1. A signal outputted from the operational amplifier circuit is supplied to the gate of a p channel type MOSFETQ41 having the source to which a source or power supply voltage Vdd is applied, and its drain output is fed back to a non-inversion input (+) of the operational amplifier circuit OP1, whereby the constant voltage like 1.2V converted to low impedance is formed.

Voltage dividing resistors 3×r0 and r0 having a resistance ratio of 3:1 are provided between the drain of the p channel type MOSFETQ41 and the circuit's ground potential to form or produce a ¼-divided constant voltage of 0.3V. The constant voltage 0.3V formed by the division in this way is outputted as the bias voltage Vbn1 through a similar operational amplifier circuit OP2, a p channel type MOSFETQ42 and an impedance converter comprised of a load resistor r1.

Figure 37:
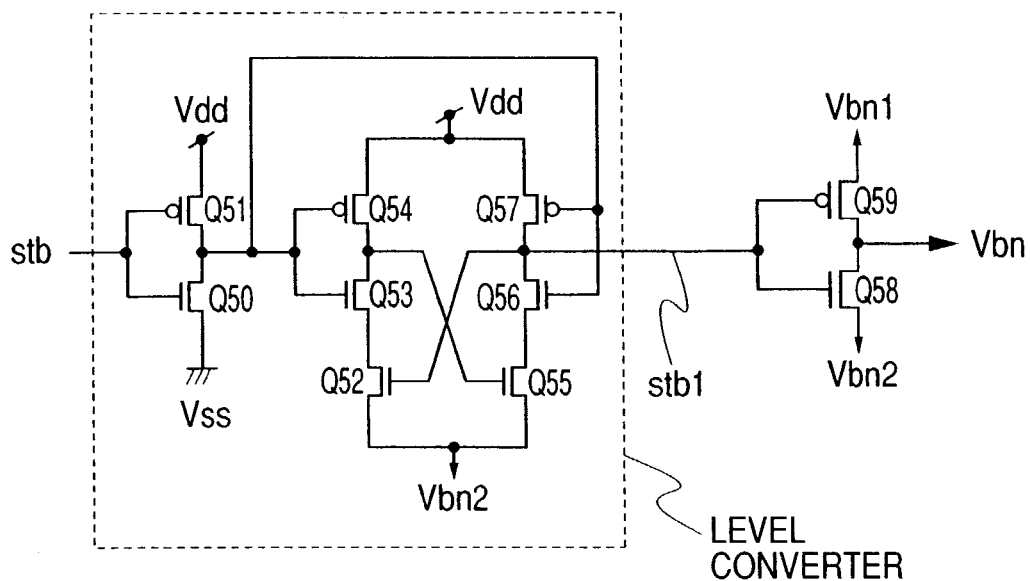
FIG. 37 is a circuit diagram illustrating one embodiment of a substrate bias voltage switching circuit for an n channel type MOSFET.

A circuit diagram illustrating one embodiment of a substrate bias voltage switching circuit for the n channel type MOSFET is shown in FIG. 37. A negative bias voltage Vbn2 formed by the charge pump circuit as described above is outputted as a substrate bias voltage Vbn through an n channel type MOSFETQ58. A positive small or micro bias voltage Vbn1 formed using a bandgap voltage is outputted as a substrate bias voltage Vbn through a p channel type MOSFETQ59. The gates of these MOSFETQ58 and Q59 are commonly connected to each other and supplied with a control signal stb1.

The gate control circuit stb1 serves as a large-amplitude signal formed by a level converter to complementarily switch-control the switch MOSFETQ58 and Q59. Namely, it is brought to a high level like a source voltage Vdd and a low level like a negative voltage Vbn2. The gate control circuit is one formed based on a control signal stb corresponding to the operation mode as described above. Such a control signal stb is such a low-amplitude signal that its signal amplitude is set with Vdd as a high level and Vss as a low level to form it by the above control circuit operated at the source voltage Vdd and ground potential Vss, for example. The control signal stb is supplied to a CMOS inverter circuit (Q50 and Q51) operated at the voltages Vdd and Vss for the purpose of a level converting operation, from which an inverted signal is formed.

Since a level converting portion is similar to the level converter shown in FIG. 31 although different in operating voltage, its detailed description will be omitted. In response to the low-amplitude signal comprised of the control signal stb and the inverted signal formed by the CMOS inverter circuit, the level converting portion performs such a level converting operation as to bring a high level to the source voltage Vdd and a low level to the negative voltage Vbn2.

A voltage relatively large under the above-described level converting operation is applied to the gates of MOSFETQ52 through Q57 and the gates of the switch MOSFETQ58 and Q59 in the MOSFETs constituting the level converter, except for the MOSFETQ50 and Q51 of the CMOS inverter circuit for forming the low-amplitude inverted signal. Therefore, high-withstand MOSFETs formed thick in gate insulating film are used to ensure gate withstand voltages for MOSFETs. As such high-withstand MOSFETs, for example, MOSFETs identical to the MOSFETs constituting the input/output circuit shown in FIG. 30 can be used.

Although the MOSFETQ52 through Q57 and switch MOSFETQ58 and Q59 constituting the level converter are not restricted in particular, a p well in which N channel type MOSFETs are formed, is fixedly supplied with the negative bias voltage Vbn2, whereas an n well in which P channel type MOSFETs are formed, is fixedly supplied with the source voltage Vdd.

Figure 38:
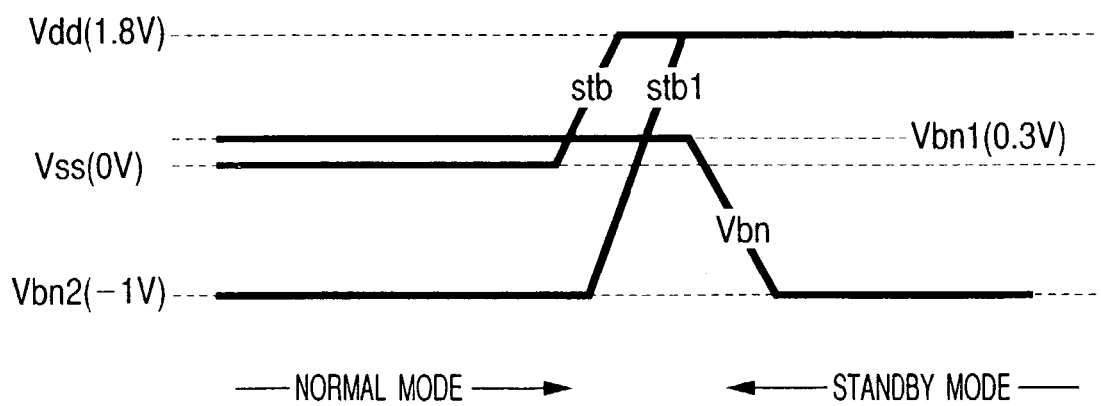
FIG. 38 is a waveform diagram for describing the operation of the substrate bias voltage switching circuit.

A waveform diagram for describing the operation of the substrate bias voltage switching circuit is shown in FIG. 38.

When a control signal stb is of a low level like a circuit's ground potential Vss, an output signal stb1 of the level converter is brought to a low level corresponding to a negative voltage Vbn2. Thus, the p channel MOSFETQ59 is turned on and the n channel type MOSFETQ58 is turned off, so that a bias voltage Vbn1 corresponding to the positive small voltage is outputted as a substrate bias voltage Vbn.

When the control signal stb is changed from the low level to a high level corresponding to a source voltage Vdd, the output signal stb1 of the level converter produces a high level corresponding to the source voltage Vdd. Thus, the p channel type MOSFETQ59 is switched to an off state and the n channel type MOSFETQ58 is switched to an on state, so that the negative voltage Vbn2 is outputted as a substrate bias voltage Vbn.

Operations and effects obtained from the above-described embodiments are as follows:

(1) An effect is obtained in that a method of setting back biases of a MOS circuit comprising a plurality of MOSFETs constituting a digital circuit, comprises supplying a first back bias voltage to a semiconductor substrate or a semiconductor well region in which the MOSFETs are formed, so that a pn junction between the semiconductor substrate or the semiconductor well region and a source region is brought to a weak forward voltage in an operating state in which an input signal is supplied to the digital circuit to obtain an output current corresponding to the input signal, and applying a second back bias voltage to the semiconductor substrate or the semiconductor well region so that the pn junction between the semiconductor substrate or the semiconductor well region and the source region is brought to a reverse voltage in a non-operating state in which a circuit operation is suspended by the input signal supplied to the digital circuit as a fixed level, whereby a threshold voltage can be reduced to achieve speeding-up upon operation, and the threshold voltage can be increased to achieve low power consumption upon standby free of the operation. (2) An effect is obtained in that the threshold voltage of each MOSFET referred to above corresponds to an intrinsic threshold voltage set so as to obtain the output current when the first back bias voltage is supplied, whereby the difference between the threshold voltages at the operation and non-operation can be increas d, and an intermediate threshold voltage corresponding to the intrinsic threshold voltag at which a source and a well are made identical in potential, can also be utilized.

(3) An effect is obtained in that the MOS circuit constituting the digital circuit comprises a CMOS circuit comprised of a p channel type MOSFET and an n channel type MOSFET, and the first and second back bias voltages different from each other are supplied in association with the p channel type MOSFET and the n channel type MOSFET respectively, whereby a high-speed operation and low power consumption can be implemented as effective ones. (4) An effect is obtained in that the first back bias voltage applied to the semiconductor substrate or the semiconductor well region so that the pn junction between the semiconductor substrate or the semiconductor well region and the source region is brought to the forward voltage, is set to less than or equal to a forward threshold voltage of the pn junction, thereby making it possible to achieve a high-speed operation while compensating for a circuit operation.

(5) An effect is obtained in that the second back bias voltage applied to the semiconductor substrate or the semiconductor well region so that the pn junction between the semiconductor substrate or the semiconductor well region and the source region is brought to the reverse voltage, is set on condition that a leak current in the pn junction is smaller than a leak current in said each MOSFET, whereby current consumption at standby free of the circuit operation can effectively be reduced.

(6) An effect is obtained in that the input signal supplied to the digital circuit is an internal signal formed by an input circuit which receives an input signal supplied from an external terminal of a semiconductor integrated circuit, and an output signal formed by the digital circuit is sent to the external terminal of the semiconductor integrated circuit through an output circuit, and the semiconductor substrate or the semiconductor well region in which MOSFETs constituting the input circuit and the output circuit are formed, is supplied with either a first voltage or a second voltage given to the input circuit as an operating voltage, whereby the transfer of signals to and from another semiconductor integrated circuit device can flexibly be performed while a margin for CMOS latch-up due to an external signal is being ensured.

(7) An effect is obtained in that a MOS integrated circuit comprises a digital circuit comprising a plurality of MOSFETs, and a bias circuit which supplies a back bias voltage to a semiconductor substrate or a semiconductor well region in which the MOSFETs are formed, and wherein in the case of an operating state in which an input signal is supplied to the digital circuit to obtain an output current corresponding to the input signal, the bias circuit supplies a first back bias voltage to a semiconductor substrate or a semiconductor well region in which the MOSFETs are formed, so that a pn junction between the semiconductor substrate or the semiconductor well region and a source region is brought to a weak forward voltage, and in the case of a non-operating state in which a circuit operation is suspended by the input signal supplied to the digital circuit as a fixed level, the bias circuit supplies a second back bias voltage to the semiconductor substrate or the semiconductor well region so that the pn junction between the semiconductor substrate or the semiconductor well region and the source region is brought to a reverse voltage, whereby low power consumption at standby can be achieved while the speeding up of the digital circuit is being achieved.

(8) An effect is obtained in that the threshold voltage of each MOSFET referred to above is set to an intrinsic threshold voltage so as to obtain the output current when the first back bias voltage is supplied, whereby the difference between the threshold voltages at the operation and non-operation is increased, thereby making it possible to achieve the speeding up of the digital circuit at the operation and low power consumption at standby, and to execute an intermediate operation mode between the two, which makes use of an intermediate threshold voltage corresponding to the intrinsic threshold voltage at which the source and the well are made identical in potential.

(9) An effect is obtained in that the MOS circuit constituting the digital circuit is configured as a CMOS circuit comprised of a p channel type MOSFET and an n channel type MOSFET, and the bias circuit has the function of supplying the first and second back bias voltages different from each other in association with the p channel type MOSFET and the n channel type MOSFET respectively, whereby a high-speed operation and low power consumption of the digital circuit can be implemented as effective ones.

(10) An effect is obtained in that the first back bias voltage applied to the semiconductor substrate or the semiconductor well region so that the pn junction between the semiconductor substrate or the semiconductor well region and the source region is brought to the forward voltage, is set to become less than or equal to a forward threshold voltage of the pn junction, thereby making it possible to compensate for the operation of the digital circuit and achieve a high-speed operation.

(11) An effect is obtained in that the second back bias voltage applied to the semiconductor substrate or the semiconductor well region so that the pn junction between the semiconductor substrate or the semiconductor well region and the source region is brought to the reverse voltage, is set within a range in which a leak current in the pn junction is smaller than a leak current in each MOSFET referred to above, whereby current consumption at standby free of the operation of the digital circuit can effectively be reduced.

(12) An effect is obtained in that an input circuit which receives an input signal supplied from an external terminal of the MOS integrated circuit therein to thereby form an input signal supplied to the digital circuit, and an output circuit which sends an output signal formed by the digital circuit to an external terminal of a semiconductor integrated circuit device, are further provided, and the semiconductor substrate or the semiconductor well region in which MOSFETs constituting the input circuit and the output circuit are formed, is supplied with either a first voltage or a second voltage given to the input circuit as an operating voltage, whereby the transfer of signals to and from another semiconductor integrated circuit device can flexibly be performed while a margin for CMOS latch-up due to an external signal is being ensured.

(13) An effect is obtained in that an internal step-down circuit which forms a stepped down third voltage in response to the first and second voltages supplied from the external terminal is further provided, and the digital circuit is operated at the stepped down third voltage and the first or second voltage corresponding to a circuit ground potential, whereby a further speeding-up and lower power consumption of an internal digital circuit can be achieved.

(14) An effect is obtained in that the bias circuit comprises a selector switch circuit which receives a plurality of voltages including the first and second substrate back bias voltages each supplied from the external terminal of the MOS integrated circuit therein and supplies the same to the semiconductor substrate or the semiconductor well region according to a control signal, whereby the speeding up and low power consumption can be realized while the setting of the substrate back bias voltages is being provided with flexibility.

(15) An effect is obtained in that the bias circuit is provided with the function of supplying the third voltage at which the digital circuit is operated, and the first or second voltage corresponding to the circuit ground potential to the semiconductor substrate or the semiconductor well region in which the MOSFETs constituting the digital circuit are formed, whereby the MOSFETs constituting the digital circuit can be switched to three types of threshold voltages.

(16) An effect is obtained in that the digital circuit is divided into a plurality of circuit blocks according to circuit functions, and the bias circuit selectively supplies the first or second back bias voltage, the third voltage and the first or second voltage corresponding to the circuit ground potential in association with operation modes set every plural circuit blocks, thereby making it possible to set the threshold voltage of each MOSFET, corresponding to the operation set for each circuit block.

(17) An effect is obtained in that in the plurality of circuit blocks, the first and second back bias voltages are switched according to the operation mode so as to be supplied to a first block which needs a high-speed operation and low power consumption, the third voltage, the first or second voltage corresponding to the circuit ground potential, and the second back bias voltage are switched according to the operation mode so as to be supplied to a second block which needs low power consumption, and the first back bias voltage, the third voltage and the first or second voltage corresponding to the circuit ground potential are switched according to the operation mode so as to be supplied to a third block which needs a high-speed operation and a fast response, whereby the threshold voltage of the optimum MOSFET obtained for each circuit block and corresponding to its operation mode can be set.

(18) An effect is obtained in that when the digital circuit is in a non-operating state, a short time suspend mode in which the third voltage and the first or second voltage corresponding to the circuit ground potential are supplied, and a long time suspend mode in which the second back bias voltage is supplied, are provided, whereby low power consumption can be achieved while a fast response is being maintained.

(19) An effect is obtained in that a first back bias voltage and a second back bias voltage supplied to the semiconductor substrate or the semiconductor well region in which p channel type MOSFETs constituting the digital circuit are formed, are set as voltages divided by an internal circuit, based on the first and second voltages, thereby making it possible to lessen a load on an external power supply unit and reduce the number of external terminals.

(20) An effect is obtained in that a first back bias voltage supplied to the semiconductor substrate or the semiconductor well region in which n channel type MOSFETs constituting the digital circuit are formed, is set as a voltage divided by an internal circuit, based on the first and second voltage or the third voltage, and a second back bias voltage is set as a negative voltage formed by a charge pump circuit comprised of an internal circuit, whereby a load on an external power supply unit can be lessened and the number of external terminals can be reduced.

(21) An effect is obtained in that each MOSFET referred to above is configured so that an impurity concentration of a semiconductor region used as a source region is higher than that of a semiconductor region constituting a drain region, whereby a leak current at the bottom of the source at the time that the source and the semiconductor region are brought to a weak forward bias state, can further be reduced.

(22) An effect is obtained in that the MOSFET is formed in a semiconductor region formed on an insulating substrate, whereby the semiconductor region can be reduced in parasitic capacitance and the switching between the substrate back bias voltages can be performed at high speed.

(23) An effect is obtained in that a semiconductor region in which the n channel type MOSFET of the MOSFETs is formed, and a semiconductor region in which the p channel type MOSFET thereof is formed, are isolated from each other by an insulating layer, whereby the parasitic capacitance of the semiconductor region can further be reduced, the switching between the substrate back bias voltages can be performed at high speed, and CMOS latch-up can be prevented from occurring.

While the invention made above by the present inventors has been described specifically by the embodiments, the invention of the present application is not limited to the embodiments. It is needless to say that various changes can be made thereto within the scope not departing from the substance thereof. For instance, an internal circuit may be one operated by a source voltage supplied from an external terminal. When the source voltage supplied from the external terminal is stepped down to form an internal source or power supply voltage, the value of the internal voltage may be a further reduced one like 1.2V in addition to 1.8V referred to above.

The internal circuit may be one operated at a plurality of types of step-down voltages. Namely, a circuit block operated at a first step-down voltage like 2.2V with respect to an external source voltage like 3.3V, and a circuit block operated at a second step-down voltage like 1.8V referred to above may exist. Since such operating voltages Vdd are supplied to the sources of p channel type MOSFETs, back bias voltages supplied to wells in association with the respective operating voltages are set to their corresponding circuit blocks. The voltage at which the source of each MOSFET and a well are reverse-biased upon standby, may be set to a voltage at which the leak current is minimized according to a device process, in addition to −1V referred to above. When the gate length is 0.2 $\mu$m, for example, the voltage can be increased up to about −1.5V.

A digital circuit is not limited to a static type circuit like a CMOS circuit. For example, even in the case of a MOS dynamic circuit of such a type that the precharge of an electrical charge to a signal output node and the output of a signal to the signal output node are performed in synchronism with a system clock signal, the present invention acts effectively when it is necessary to prevent the flow of a leak current between the output node precharged upon non-operation and each MOSFET constituting an off-state logic block. The present invention can widely be used in a method of setting biases of MOSFETs and a MOS integrated circuit wherein a leak current in a state in which a circuit comprised of MOSFETs is turned off at standby, is reduced, and a high-speed operation is performed upon operation.

As viewed from another standpoint, the present invention includes such a technical idea that the threshold voltage of each MOSFET is changed on a software basis through the use of each substrate bias voltage. Therefore, the present invention can widely be used in a bias setting method and a MOS integrated circuit wherein the threshold voltage can be changed to three types of threshold voltages at maximum every circuit blocks or operation modes through the use of substrate bias voltages.

Industrial Applicability

The present invention can widely be used in a semiconductor memory circuit wherein a self-amplifying function is provided within a dynamic memory cell, and a semiconductor integrated circuit device equipped therewith.

What is claimed is:

1. A semiconductor integrated circuit including a plurality of operation modes, comprising:
    a plurality of circuit blocks, each comprising a plurality of P channel MOS transistors, and a plurality of N channel MOS transistors,
    wherein said plurality of circuit blocks include a first circuit block and a second circuit block,
    wherein said operation modes include a first mode and a second mode,
    wherein said N channel MOS transistors included in said first circuit block are provided a bias voltage higher than a ground voltage in said first mode, and are provided a bias voltage lower than said ground voltage in said second mode,
    wherein said P channel MOS transistors included in said first circuit block are provided a bias voltage lower than a power supply voltage in said first mode, and are provided a bias voltage higher than said power supply voltage in said second mode,
    wherein said N channel MOS transistors included in said second circuit block are provided a bias voltage lower than said ground voltage in said second mode,
    wherein said P channel MOS transistors included in said second circuit block are provided a bias voltage higher than said power supply voltage in said second mode,
    wherein said N channel MOS transistors included in said second circuit block are provided a bias voltage equal to said ground voltage in said first mode, and
    wherein said P channel MOS transistors included in said second circuit block are provided a bias voltage equal to said power supply voltage in said first mode.

2. A semiconductor integrated circuit according to claim 1, further comprising a bias voltage control circuit which controls bias voltages of said plurality of circuit blocks.

3. A semiconductor integrated circuit according to claim 1, further comprising a bias voltage providing circuit which generates a plurality of bias voltages corresponding to said plurality of operation modes.

* * * * *